US012690462B2

(12) United States Patent
Xie et al.

(10) Patent No.: US 12,690,462 B2
(45) Date of Patent: Jul. 21, 2026

(54) THREE-DIMENSIONAL MEMORY DEVICES, SYSTEMS, AND METHODS FOR FORMING THE SAME

(71) Applicant: YANGTZE MEMORY TECHNOLOGIES CO., LTD., Wuhan (CN)

(72) Inventors: Jingtao Xie, Wuhan (CN); Bingjie Yan, Wuhan (CN); Kun Zhang, Wuhan (CN); Wenxi Zhou, Wuhan (CN); Zhiliang Xia, Wuhan (CN); Zongliang Huo, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 601 days.

(21) Appl. No.: 17/891,064

(22) Filed: Aug. 18, 2022

(65) Prior Publication Data

US 2024/0063140 A1     Feb. 22, 2024

(51) Int. Cl.
| | |
|---|---|
| *H10B 41/27* | (2023.01) |
| *H10B 43/27* | (2023.01) |
| *H10W 20/20* | (2026.01) |
| *H10W 42/00* | (2026.01) |

(52) U.S. Cl.
CPC .......... *H10W 42/121* (2026.01); *H10B 41/27* (2023.02); *H10B 43/27* (2023.02); *H10W 20/20* (2026.01)

(58) Field of Classification Search
CPC ........ H10B 41/27; H10B 43/27; H10B 43/50; H10B 41/10; H01L 25/18; H01L 23/5386; H01L 21/76897; H10W 20/20; H10W 90/00; H10W 20/069; H10W 70/65; H10W 70/611
See application file for complete search history.

(56) References Cited

U.S. PATENT DOCUMENTS

| | | | | |
|---|---|---|---|---|
| 2022/0181273 A1* | 6/2022 | Kwon | .................... | H01L 23/562 |
| 2022/0230917 A1* | 7/2022 | Amano | ............. | H01L 21/76895 |
| 2022/0352197 A1* | 11/2022 | Matsuno | ................ | H10B 41/10 |

* cited by examiner

*Primary Examiner* — Jessica S Manno
*Assistant Examiner* — Sandra Milena Rodriguez Villanu
(74) *Attorney, Agent, or Firm* — BAYES PLLC

(57) ABSTRACT

A three-dimensional (3D) memory device includes a stack, a plurality of contact structures, and a plurality of support structures. The stack in an insulating structure includes conductive layers and dielectric layers stacked alternatingly, and the stack includes a staircase structure. Each contact structure extends through the insulating structure and is in contact with a respective conductive layer in the staircase structure. The support structures extend through the stack in the staircase structure. The contact structures are arranged in a first row and a second row, the first row of contact structures is in electrical contact with the peripheral device, and the second row of contact structures is in electrical insulation with the peripheral device.

19 Claims, 21 Drawing Sheets

<u>1900</u>

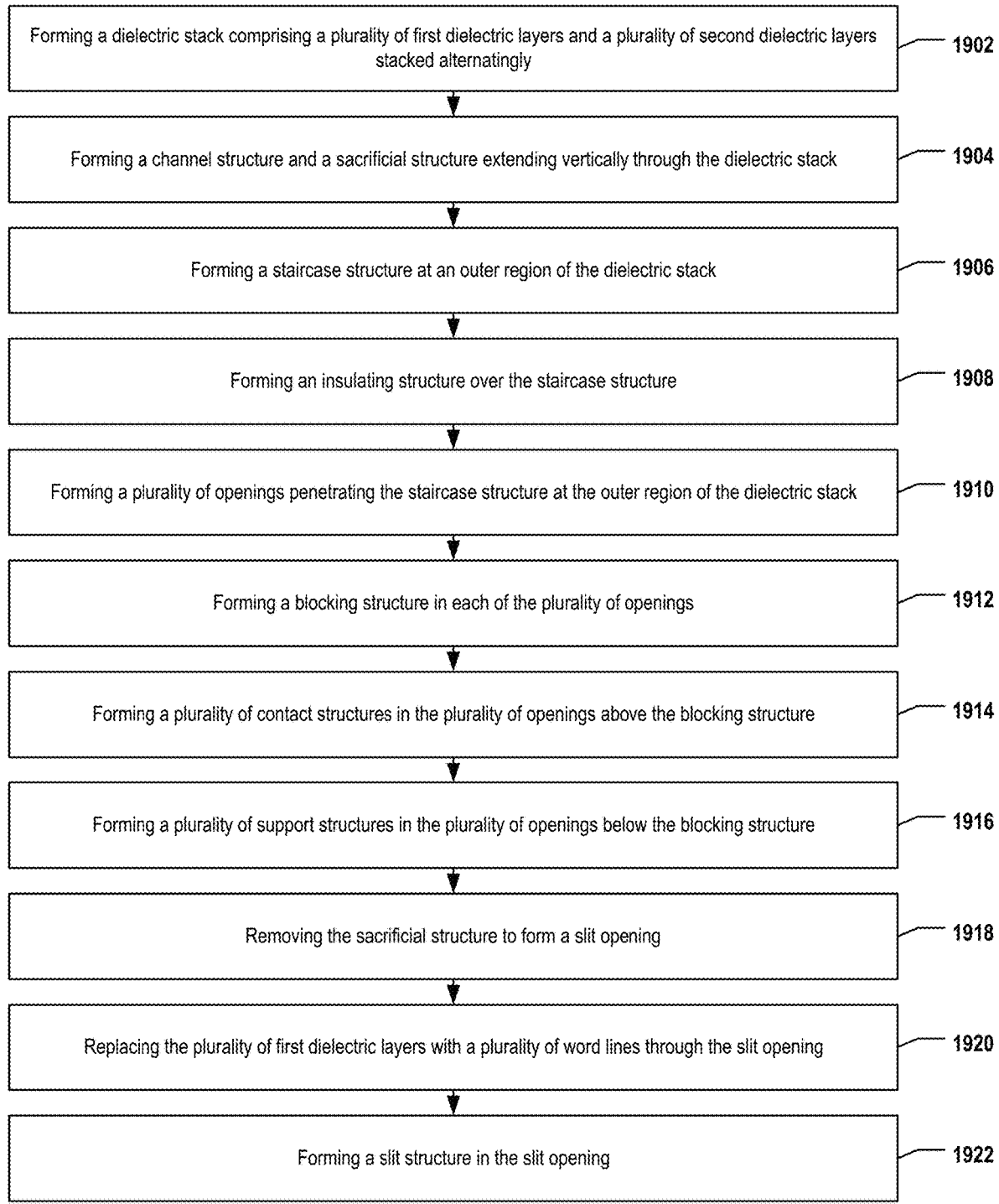

Forming a dielectric stack comprising a plurality of first dielectric layers and a plurality of second dielectric layers stacked alternatingly ⸺ 1902

Forming a channel structure and a sacrificial structure extending vertically through the dielectric stack ⸺ 1904

Forming a staircase structure at an outer region of the dielectric stack ⸺ 1906

Forming an insulating structure over the staircase structure ⸺ 1908

Forming a plurality of openings penetrating the staircase structure at the outer region of the dielectric stack ⸺ 1910

Forming a blocking structure in each of the plurality of openings ⸺ 1912

Forming a plurality of contact structures in the plurality of openings above the blocking structure ⸺ 1914

Forming a plurality of support structures in the plurality of openings below the blocking structure ⸺ 1916

Removing the sacrificial structure to form a slit opening ⸺ 1918

Replacing the plurality of first dielectric layers with a plurality of word lines through the slit opening ⸺ 1920

Forming a slit structure in the slit opening ⸺ 1922

THREE-DIMENSIONAL MEMORY DEVICES, SYSTEMS, AND METHODS FOR FORMING THE SAME

CROSS-REFERENCE TO RELATED APPLICATIONS

This application is related to U.S. application Ser. No. 17/891,055, filed on Aug. 18, 2022, entitled "THREE-DIMENSIONAL MEMORY DEVICES, SYSTEMS, AND METHODS FOR FORMING THE SAME," which is hereby incorporated by reference in its entirety.

BACKGROUND

The present disclosure relates to memory devices and fabrication methods thereof, and specifically, relates to the three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for facilitating operations of the memory array.

SUMMARY

Implementations of 3D memory devices and methods for forming the same are disclosed herein.

In one aspect, a 3D memory device includes a stack, a plurality of contact structures, and a plurality of support structures. The stack in an insulating structure includes a plurality of conductive layers and a plurality of dielectric layers stacked alternatingly, and the stack includes a staircase structure. The plurality of contact structures each extends through the insulating structure and is in contact with a respective conductive layer of the plurality of conductive layers in the staircase structure. The plurality of support structures extend through the stack in the staircase structure. The plurality of contact structures are arranged in a first row and a second row along a first direction, the first row is adjacent and parallel to the second row, the first row of the plurality of contact structures is in electrical contact with the peripheral device, and the second row of the plurality of contact structures is in electrical insulation with the peripheral device.

In some implementations, each of the plurality of contact structures further includes a staircase contact in contact with the respective conductive layer of the plurality of conductive layers.

In some implementations, the staircase contact is disposed between the plurality of contact structures and the plurality of support structures.

In some implementations, the plurality of contact structures and the plurality of support structures overlap in a plan view of the 3D memory device.

In some implementations, each of the plurality of support structures aligns one of the plurality of contact structures.

In some implementations, the plurality of contact structures and the plurality of support structures include different materials.

In some implementations, the plurality of support structures include a dielectric material. In some implementations, the plurality of contact structures include a conductive material.

In some implementations, the 3D memory device further includes a semiconductive layer under the stack, and a channel structure extending through the stack and in contact with the semiconductive layer. The plurality of support structures extend to the semiconductive layer.

In some implementations, the semiconductive layer and the plurality of contact structures are separated by at least one of the plurality of conductive layers.

In some implementations, each of the plurality of contact structures includes a first end away from the staircase contact and a second near the staircase contact, and a width of the first end is greater than a width of the second end. In some implementations, each of the plurality of support structures includes a third end near the staircase contact and a fourth end away from the staircase contact, and a width of the third end is greater than a width of the fourth end. In some implementations, the width of the first end is greater than the width of the third end.

In another aspect, a system includes a 3D memory device configured to store data and a memory controller coupled to the 3D memory device. The 3D memory device includes a stack, a plurality of contact structures, and a plurality of support structures. The stack in an insulating structure includes a plurality of conductive layers and a plurality of dielectric layers stacked alternatingly, and the stack includes a staircase structure. The channel structure extends through the stack. The plurality of contact structures each extends through the insulating structure and is in contact with a respective conductive layer of the plurality of conductive layers in the staircase structure. The plurality of support structures extend through the stack in the staircase structure. The plurality of contact structures are arranged in a first row and a second row along a first direction, the first row is adjacent and parallel to the second row, the first row of the plurality of contact structures is in electrical contact with the peripheral device, and the second row of the plurality of contact structures is in electrical insulation with the peripheral device. The memory controller is coupled to the 3D memory device and configured to control operations of the plurality of memory strings through the peripheral device.

In still another aspect, a method for forming a 3D memory device is disclosed. A dielectric stack including a plurality of first dielectric layers and a plurality of second dielectric layers stacked alternatingly is formed. A staircase structure is formed at the dielectric stack exposing a portion of the plurality of first dielectric layers. An insulating structure is formed over the staircase structure. A plurality of openings are formed penetrating the dielectric stack and the insulating structure. Each of the plurality of openings includes a blocking structure inside the opening. A plurality of contact structures are formed in the plurality of openings above the blocking structure. A plurality of support structures are formed in the plurality of openings below the blocking structure. The plurality of first dielectric layers are replaced with a plurality of word lines.

In some implementations, a portion of the dielectric stack is removed to form the staircase structure exposing the plurality of first dielectric layers. Every two adjacent first dielectric layers at the outer region of the dielectric stack are offset by a distance in the horizontal direction.

In some implementations, a portion a semiconductor layer is formed on each first dielectric layer at an outer region of the dielectric stack, and a plurality of openings are formed penetrating the semiconductor layer.

In some implementations, a polysilicon layer is formed on each first dielectric layer at the outer region of the dielectric stack.

In some implementations, a selective epitaxial growth (SEG) operation is performed to form the blocking structure on the semiconductor layer exposed by the plurality of openings.

In some implementations, an oxidation operation is performed on the semiconductor layer exposed by the plurality of openings to form the blocking structure on the semiconductor layer exposed by the plurality of openings.

In some implementations, a third dielectric layer is formed in the plurality of openings, and a portion of the third dielectric layer is removed to expose a bottom of a sacrificial structure.

In some implementations, the plurality of openings are formed penetrating the insulating structure and the dielectric stack at the outer region of the dielectric stack.

In some implementations, a slit opening is formed in the dielectric stack. The plurality of first dielectric layers, the blocking structure, and the stop layer are removed through the slit opening to form a plurality of cavities. The plurality of word lines are formed in the plurality of cavities. In some implementations, a slit structure is formed in the slit opening.

In some implementations, a peripheral device is bonded on the dielectric stack in contact with a portion of the plurality of contact structures.

In yet another aspect, a method for forming a 3D memory device is disclosed. A dielectric stack is formed including a plurality of first dielectric layers and a plurality of second dielectric layers stacked alternatingly. A staircase structure is formed at the dielectric stack exposing a portion of the plurality of first dielectric layers. An insulating structure is formed over the staircase structure. A plurality of openings is formed penetrating the dielectric stack and the insulating structure. The plurality of openings penetrating the dielectric stack and the insulating structure are formed in one photolithography operation. A blocking structure is formed inside each of the plurality of openings. A plurality of contact structures are formed in the plurality of openings above the blocking structure. A plurality of support structures are formed in the plurality of openings below the blocking structure. The plurality of first dielectric layers are replaced with a plurality of word lines.

BRIEF DESCRIPTION OF THE DRAWINGS

The accompanying drawings, which are incorporated herein and form a part of the specification, illustrate aspects of the present disclosure and, together with the description, further serve to explain the principles of the present disclosure and to enable a person skilled in the pertinent art to make and use the present disclosure.

FIG. 19 illustrates a flowchart of an exemplary method for forming a 3D memory device, according to some aspects of the present disclosure.

Figure 1:
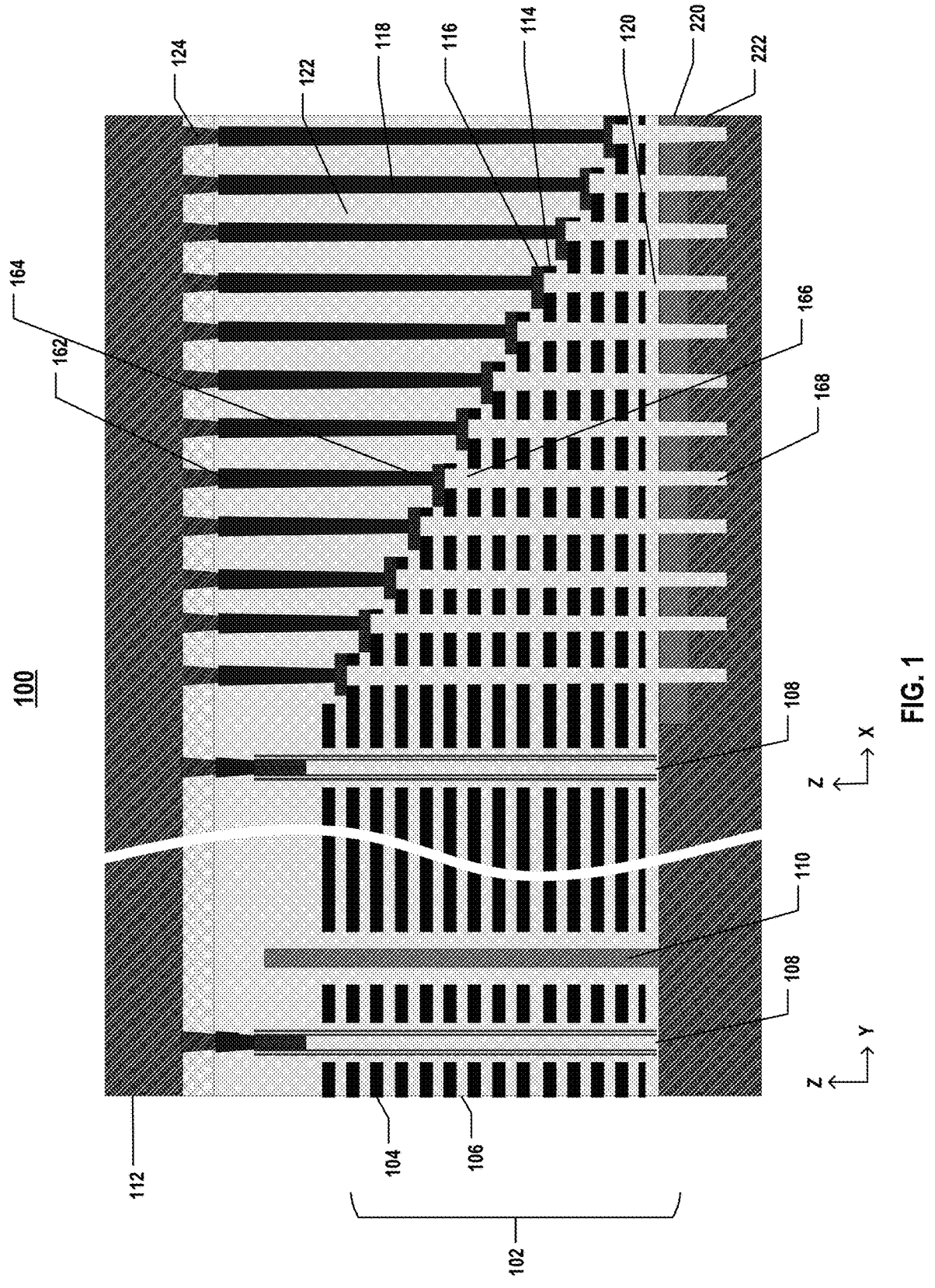
FIG. 1 illustrates a cross-section of an exemplary 3D memory device, according to some aspects of the present disclosure.

The present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present disclosure.

In general, terminology may be understood at least in part from usage in context. For example, the term "one or more" as used herein, depending at least in part upon context, may be used to describe any feature, structure, or characteristic in a singular sense or may be used to describe combinations of features, structures, or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations), and the spatially relative descriptors used herein may likewise be interpreted accordingly.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layers thereupon, thereabove, and/or therebelow. A layer can include multiple layers. For example, an interconnect layer can include one or more conductive layers and contact layers (in which interconnect lines and/or vertical interconnect access (via) contacts are formed) and one or more dielectric layers.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductive materials, such as silicon, germanium, gallium arsenide, indium phosphide, etc. Alternatively, the substrate can be made from an electrically non-conductive material, such as a glass, a plastic, or a sapphire wafer.

As used herein, the term "3D memory device" refers to a semiconductive device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

A 3D semiconductive device can be formed by stacking semiconductive wafers or dies and interconnecting them vertically so that the resulting structure acts as a single device to achieve performance improvements at reduced power and a smaller footprint than conventional planar processes. However, as the number of 3D memory layers continues to increase, the control of the word line replacement process becomes more and more difficult. During the word line replacement process, the support structure (dummy channel structure) is used to support the dielectric stack to avoid collapse or word line bending. The limitations of the spaces between adjacent dummy channel structures and between the dummy channel structure and the contact structure make the size of the 3D semiconductive device hard to be shrunk. In addition, as the number of 3D memory layers continues to increase, the landing window for the contact structure to contact the word lines has more stringent requirements. The landing window requirements may contradict the limitations of the spaces between the dummy channel structure and the contact structure. The present application is introduced to overcome these deficiencies.

FIG. 1 illustrates a cross-section of an exemplary 3D memory device 100, according to some aspects of the present disclosure. For the purpose of better describing the present disclosure, the cross-sections of the memory stack structure and the staircase structure are illustrated in the same drawings in the present disclosure, and the coordinates of x-direction, y-direction, and z-direction are noted in FIG. 1 to show the perpendicularity of the cross-sections of the memory stack structure and the staircase structure.

As shown in FIG. 1, 3D memory device 100 includes a memory stack 102 having a plurality of conductive layers 104 and a plurality of dielectric layers 106 stacked alternatingly. An outer region of the memory stack 102 is formed a staircase structure 114, and an insulating structure 122 is formed to cover staircase structure 114. A channel structure 108 is formed in memory stack 102 and extends vertically (along the z-direction) through memory stack 102. A plurality of contact structures 118 are formed in insulating structure 122, and each contact structure 118 extends vertically (along the z-direction) through insulating structure 122 and in contact with a respective conductive layer 104 of the plurality of conductive layers 104 in staircase structure 114. A plurality of support structures 120 are formed in the outer region of the memory stack 102, and each support structure 120 extends vertically (along the z-direction) through memory stack 102.

In some implementations, dielectric layers 106 may include dielectric materials including, but not limited to, silicon oxide, silicon nitride, silicon oxynitride, or any combination thereof. In some implementations, conductive layers 104 may form the word lines and may include conductive materials including, but not limited to, tungsten (W), cobalt (Co), copper (Cu), aluminum (Al), polysilicon, doped silicon, silicides, or any combination thereof.

Channel structure 108 may extend through memory stack 102, and the bottom of channel structure 108 may contact a source of 3D memory device 100. In some implementations, channel structure 108 may include a semiconductive channel and a memory film formed over a semiconductive channel. The meaning of "over" here, besides the explanation stated above, should also be interpreted "over" something from the top side or from the lateral side. In some implementations, channel structure 108 may also include a dielectric core in the center of channel structure 108.

As shown in FIG. 1, 3D memory device 100 further includes staircase structure 114 on one or more sides of memory stack 102 for purposes such as word line fan-out. In some implementations, the word line contacts may land on staircase structure 114 along the z-direction. In some implementations, the outer region of memory stack 102 may include multiple staircase structures 114. The corresponding edges of the conductive/dielectric layer pairs along the vertical direction away from the bottom of memory stack 102 (the x-direction) can be staggered laterally toward channel structure 108. In other words, the edges of memory stack 102 in staircase structures 114 can be tilted toward the inner region of memory stack 102. In some implementations, the length of the conductive/dielectric layer pairs increases from the top to the bottom, or from the bottom to the top.

In some implementations, the top layer in each level of staircase structure 114 (e.g., each conductive/dielectric layer pair in FIG. 1) is conductive layer 104 for interconnection in the vertical directions. In some implementations, one or more than one adjacent level of staircase structure 114 are offset by a nominally same distance in the vertical direction and a nominally same distance in the lateral direction. Each offset thus can form a "landing area" for interconnection with the word lines of 3D memory device 100 in the vertical direction. In some implementations, a staircase contact 116 may be formed on the landing area, and therefore, the total thickness of conductive layer 104 and staircase contact 116 in the landing area may be greater than other areas, as shown in FIG. 1.

In the present application, as shown in FIG. 1, contact structures 118 are formed in insulating structure 122, and each contact structure 118 extends vertically (along the z-direction) through insulating structure 122 and in contact with staircase contact 116 on the respective conductive layer 104 in staircase structure 114. Each contact structure 118 is in electric contact with one of the plurality of word lines, respectively. In some implementations, the word lines (conductive layers 104) are in electric contact with contact structures 118 at the edge portion of the word lines through staircase contact 116. In some implementations, staircase contact 116 may include conductive materials including, but not limited to, W, Co, Cu, Al, polysilicon, doped silicon, silicides, or any combination thereof. In some implementations, staircase contact 116 and conductive layer 104 may be formed by the same material. In some implementations, staircase contact 116 and conductive layer 104 may be formed together in a word line replacement operation, which is described in detail below.

Each support structure 120 may vertically (along the z-direction) align one of the plurality of contact structures 118. In other words, contact structures 118 and support structures 120 may overlap in a plan view of 3D memory device 100. In some implementations, support structures 120 may include dielectric materials including, but not limited to, silicon oxide, silicon nitride, silicon oxynitride, or any combination thereof. In some implementations, each support structure 120 is in contact with one of contact structures 118. In some implementations, support structure 120 and contact structures 118 may be formed by different materials.

In some implementations, 3D memory device 100 may further include a slit structure 110. Slit structures 110 may extend vertically along the z-direction through memory stack 102 and may also extend laterally along the x-direction to separate memory stack 102 into multiple fingers. In some implementations, slit structures 110 may include a slit contact, formed by filling the slit opening with conductive materials including but not limited to, W, Co, Cu, Al, polysilicon, silicides, or any combination thereof. Slit structures 110 may further include a composite spacer disposed laterally between the slit contact and conductive layers 104 and dielectric layers 106 to electrically insulate the gate line slit structure from surrounding conductive layers 104 (the gate conductive in memory stacks). In some implementations, slit structures 110 may include dielectric materials when the slit contact is not required in 3D memory device 100.

In some implementations, 3D memory device 100 may further include a peripheral device 112 disposed above memory stack 102 and in electric contact with the plurality of channel structures 108 and contact structures 118. In some implementations, peripheral device 112 may be formed separately on another substrate and be boned on memory stack 102. In some implementations, when memory stack 102 is flipped over, peripheral device 112 may be located under memory stack 102. In some implementations, peripheral device 112 may be located aside memory stack 102, and the location of peripheral device 112 is not limited.

In some implementations, 3D memory device 100 may further include a first semiconductive layer 220 and a second semiconductive layer 222 disposed under memory stack 102. In some implementations, channel structures 108 may extend through memory stack 102 and in contact with second semiconductive layer 222. In some implementations, support structures 120 may extend through first semiconductive layer 220 and extend into second semiconductive layer 222. In some implementations, first semiconductive layer 220 and/or second semiconductive layer 222 and contact structures 118 are separated by at least one of conductive layers 104.

Figure 2:
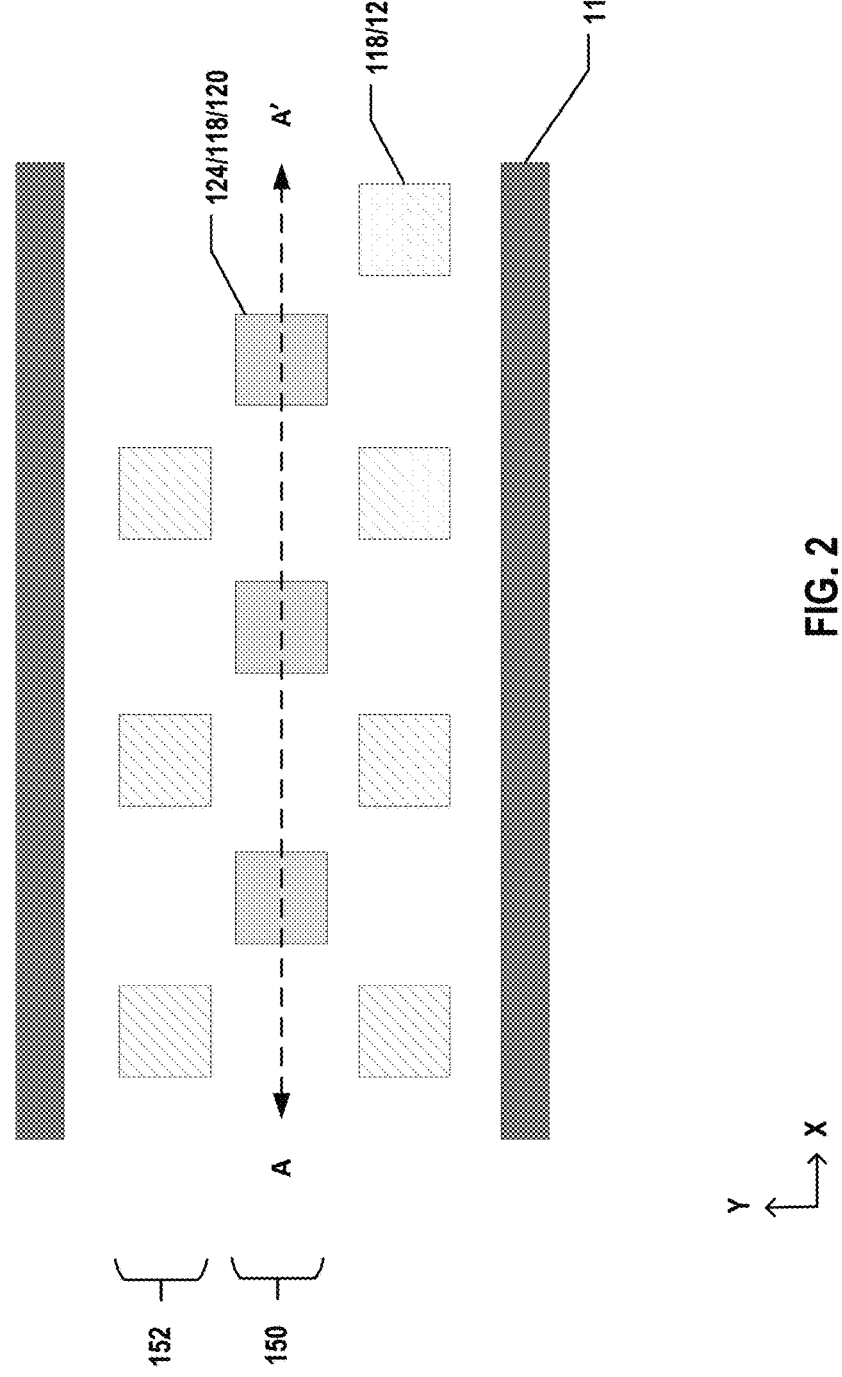
FIG. 2 illustrates a plan view of an exemplary 3D memory device, according to some aspects of the present disclosure.

In some implementations, contact structures 118 are arranged in multiple rows, and only a portion of the rows of contact structures 118 is directly or electrically connected to peripheral device 112 through a plurality of peripheral contacts 124, as shown in FIG. 2. Peripheral device 112 may include peripheral circuits (a.k.a. control and sensing circuits), which may be any suitable digital, analog, and/or mixed-signal circuits used for facilitating the operations of the memory cells in channel structures 108. For example, the peripheral circuits can include one or more of a page buffer, a decoder (e.g., a row decoder and a column decoder), a sense amplifier, a driver (e.g., a word line driver), an input/output (I/O) circuit, a charge pump, a voltage source or generator, a current or voltage reference, any portions (e.g., a sub-circuit) of the functional circuits mentioned above, or any active or passive components of the circuit (e.g., transistors, diodes, resistors, or capacitors). The peripheral circuits can use complementary metal-oxide-semiconductor (CMOS) technology, e.g., which can be implemented with logic processes in any suitable technology nodes.

In some implementations, contact structure 118 may include a first end 162 away from staircase contact 116 and a second end 164 near staircase contact 116, and a width of first end 162 is greater than a width of second end 164. In some implementations, support structure 120 may include a third end 166 near staircase contact 116 and a fourth end 168 away from staircase contact 116, and a width of third end 166 is greater than a width of fourth end 168. In some implementations, the width of first end 162 is greater than the width of third end 166.

FIG. 2 illustrates a plan view of 3D memory device 100, according to some aspects of the present disclosure. As shown in FIG. 2, contact structures 118 are arranged in a first row 150 and a second row 152 along the x-direction, and first row 150 is adjacent and parallel to second row 152. Contact structures 118 shown in FIG. 1 is the cross-section along line AA' in FIG. 2. In some implementations, the stacks of contact structures 118 and support structures 120 in first row 150 are electrically connected to peripheral device 112 through peripheral contacts 124. In some implementations, the stacks of contact structures 118 and support structures 120 in second row 152 are electrically insulated with peripheral device 112. In other words, only contact structures 118 in first row 150 are electrically connected to peripheral device 112.

In some implementations, contact structures 118 in first row 150 are in electric contact with peripheral device 112, and each contact structure 118 is in electric contact with one of the plurality of word lines. Therefore, peripheral device 112 is in electric contact with the word lines (conductive layers 104) through staircase contact 116, contact structures 118 in first row 150, and peripheral contacts 124. In some implementations, contact structures 118 in second row 152 are not in contact with peripheral device 112, and the stacks of contact structures 118 and support structures 120 in second row 152 may be used for supporting the structure of the dielectric stack to avoid collapse or word line bending during the word line replacement process.

By forming support structures 120 vertically aligning contact structures 118 and forming contact structures 118 and support structures 120 through opposite sides of 3D memory device 100, the supporting strength during the manufacturing processes can be improved. In addition, the space window for the contact landing design can be increased. Hence, the number of 3D memory layers and the size of 3D memory device 100 can be taken into consideration together without conflict.

FIGS. 3-18 illustrate cross-sections of 3D memory device 100 at different stages of a manufacturing process, according to some aspects of the present disclosure. FIG. 19 illustrates a flowchart of a method 1900 for forming 3D memory device 100, according to some aspects of the present disclosure. For the purpose of better describing the present disclosure, the cross-sections of 3D memory device 100 in FIGS. 3-18 and method 1900 in FIG. 19 will be discussed together. It is understood that the operations shown in method 1900 are not exhaustive and that other operations may be performed as well before, after, or between any of the illustrated operations. Further, some of the operations may be performed simultaneously, or in a different order than shown in FIGS. 3-18 and FIG. 19.

Figure 3:
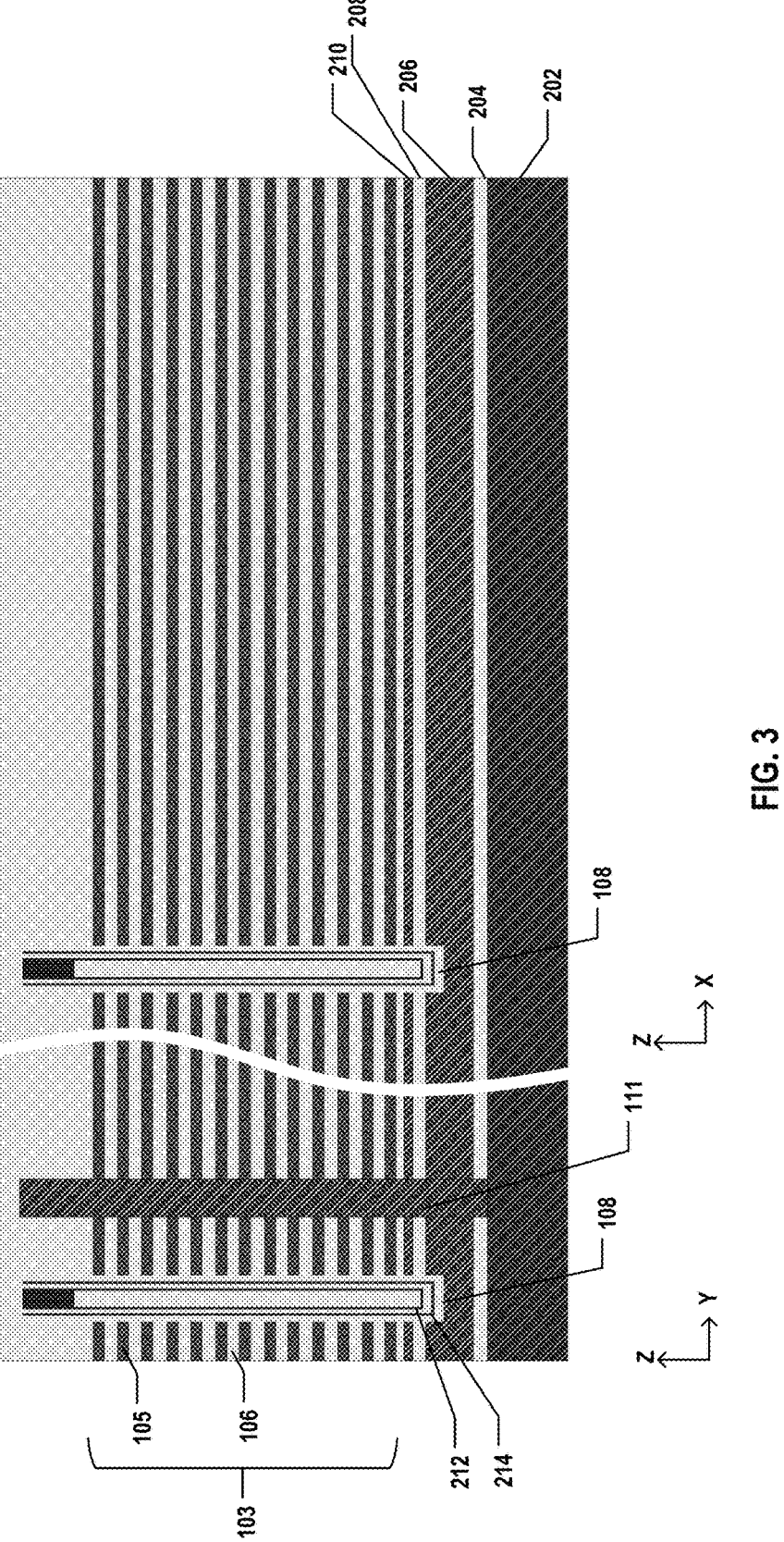
FIGS. 3-18 illustrate cross-sections of an exemplary 3D memory device at different stages of a manufacturing process, according to some aspects of the present disclosure.

As shown in FIG. 3, a dielectric layer 204 is formed on a substrate 202, and a semiconductive layer 206 is formed on dielectric layer 204. In some implementations, substrate 202 may be a doped semiconductive layer. In some implementations, substrate 202 may be a silicon substrate. In some implementations, dielectric layer 204 may include a layer of silicon oxide. In some implementations, semiconductive layer 206 may include a doped or undoped polysilicon layer. In some implementations, dielectric layer 204 and semiconductive layer 206 may be sequentially deposited by one or more thin film deposition processes including, but not limited to, chemical vapor deposition (CVD), physical vapor deposition (PVD), atomic layer deposition (ALD), or any combination thereof.

In some implementations, a dielectric layer 208 and a semiconductive layer 210 may be formed on semiconductive layer 206. In some implementations, dielectric layer 208 may include silicon oxide, and semiconductive layer 210 may include a doped or undoped polysilicon layer. In some implementations, semiconductive layer 206 and semiconductive layer 210 may include the same material. In some implementations, dielectric layer 208 may function as a stop layer when removing semiconductive layer 206 from the backside of 3D memory device 100 in later operations. In some implementations, semiconductive layer 210 may function as a stop layer when removing a bottom portion of the channel structure from the backside of 3D memory device 100 in later operations. In some implementations, dielectric layer 204, semiconductive layer 206, dielectric layer 208, and semiconductive layer 210 may be sequentially deposited by one or more thin film deposition processes including, but not limited to, CVD, PVD, ALD, or any combination thereof.

As shown in FIG. 3 and operation 1902 in FIG. 19, a dielectric stack 103 is formed on semiconductive layer 210. Dielectric stack 103 may include a plurality of dielectric layers 105 and dielectric layers 106 stacked alternatingly. The dielectric layer pairs, including dielectric layers 105 and dielectric layers 106, may extend along the x-direction and the y-direction. In some implementations, each dielectric layer 106 may include a layer of silicon oxide, and each dielectric layer 105 may include a layer of silicon nitride. The dielectric layer pairs may be formed by one or more thin film deposition processes including, but not limited to, CVD, PVD, ALD, or any combination thereof.

As shown in FIG. 3 and operation 1904 in FIG. 19, channel structures 108 and a sacrificial structure 111 are formed in dielectric stack 103 extending vertically along the z-direction. In some implementations, a channel hole is formed in dielectric stack 103 extending vertically along the z-direction. In some implementations, the channel hole may extend to semiconductive layer 206 and expose semiconductive layer 206. In some implementations, fabrication processes for forming the channel hole may include wet etching and/or dry etching, such as deep reactive ion etching (DRIE). Then, channel structures 108 are formed in the channel hole. Channel structures 108 may extend vertically through dielectric stack 103. In some implementations, channel structure 108 may be a pillar-shaped structure.

Each channel structure 108 may include a memory film 214 and a semiconductive channel 212. In some implementations, channel structure 108 may also include a dielectric core in the center of channel structure 108. In some implementations, memory film 214 is a composite layer including a tunneling layer, a storage layer (also known as a "charge trap layer"), and a blocking layer.

The dielectric core, semiconductive channel 212, and memory film 214 (including the tunneling layer, the storage layer, and the blocking layer) are arranged radially from the center toward the outer surface of the pillar in this order, according to some implementations. In some implementations, the tunneling layer may include silicon oxide, silicon oxynitride, or any combination thereof. In some implementations, the storage layer may include silicon nitride, silicon oxynitride, silicon, or any combination thereof. In some implementations, the blocking layer may include silicon oxide, silicon oxynitride, high dielectric constant (high-k) dielectrics, or any combination thereof. In one example, memory film 214 may include a composite layer of silicon oxide/silicon oxynitride (or silicon nitride)/silicon oxide (ONO). In some implementations, a high-k dielectric layer may be further formed between dielectric stack 103 and the blocking layer.

In some implementations, a sacrificial structure opening may be formed in dielectric stack 103 extending vertically along the z-direction. In some implementations, the sacrificial structure opening may extend to substrate 202 and expose substrate 202. In some implementations, fabrication processes for forming the sacrificial structure opening may include wet etching and/or dry etching, such as DRIE. Then, sacrificial structure 111 is formed in the sacrificial structure opening. In some implementations, sacrificial structure 111 may include polysilicon.

Figure 4:
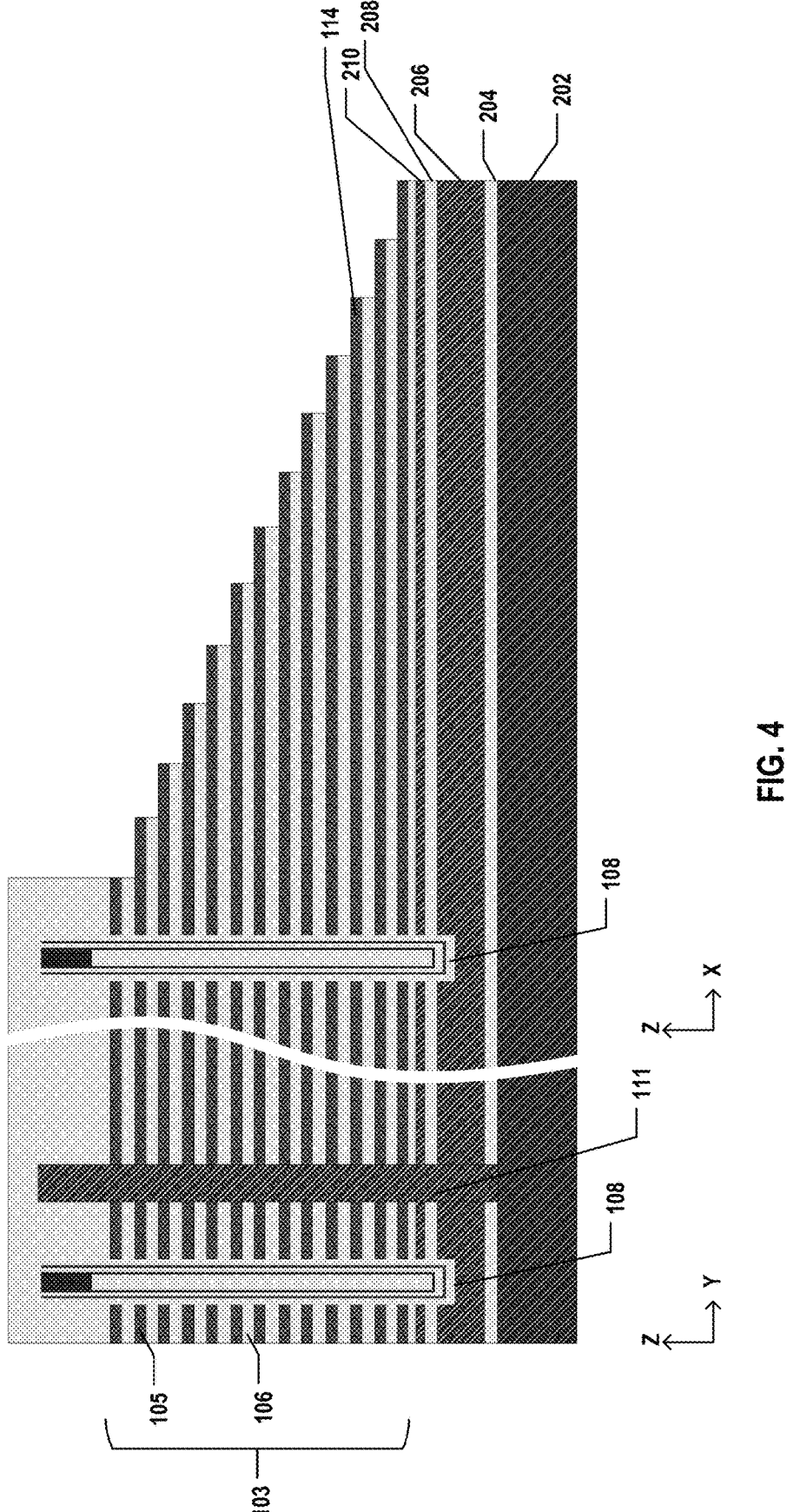

As shown in FIG. 4 and operation 1906 in FIG. 19, staircase structure 114 is formed at the outer region of dielectric stack 103. In some implementations, the outer region of dielectric stack 103 may include multiple staircase structures 114. The corresponding edges of dielectric stack 103 along the vertical direction away from the bottom of dielectric stack 103 (the positive z-direction) can be staggered laterally toward channel structure 108. In other words, the edges of dielectric stack 103 in staircase structures 114 can be tilted toward the inner region of dielectric stack 103. In some implementations, the length of the dielectric layer pairs increases from the top to the bottom.

In some implementations, the top layer in each level of staircase structure 114 (e.g., each dielectric layer pair in FIG. 4) is dielectric layer 105. After dielectric layer 105 is replaced by the conductive layers in the later operations, staircase structure 114 may be the word line fan-out. In some implementations, the formation of staircase structure 114 may include multiple etch operations.

Figure 5:
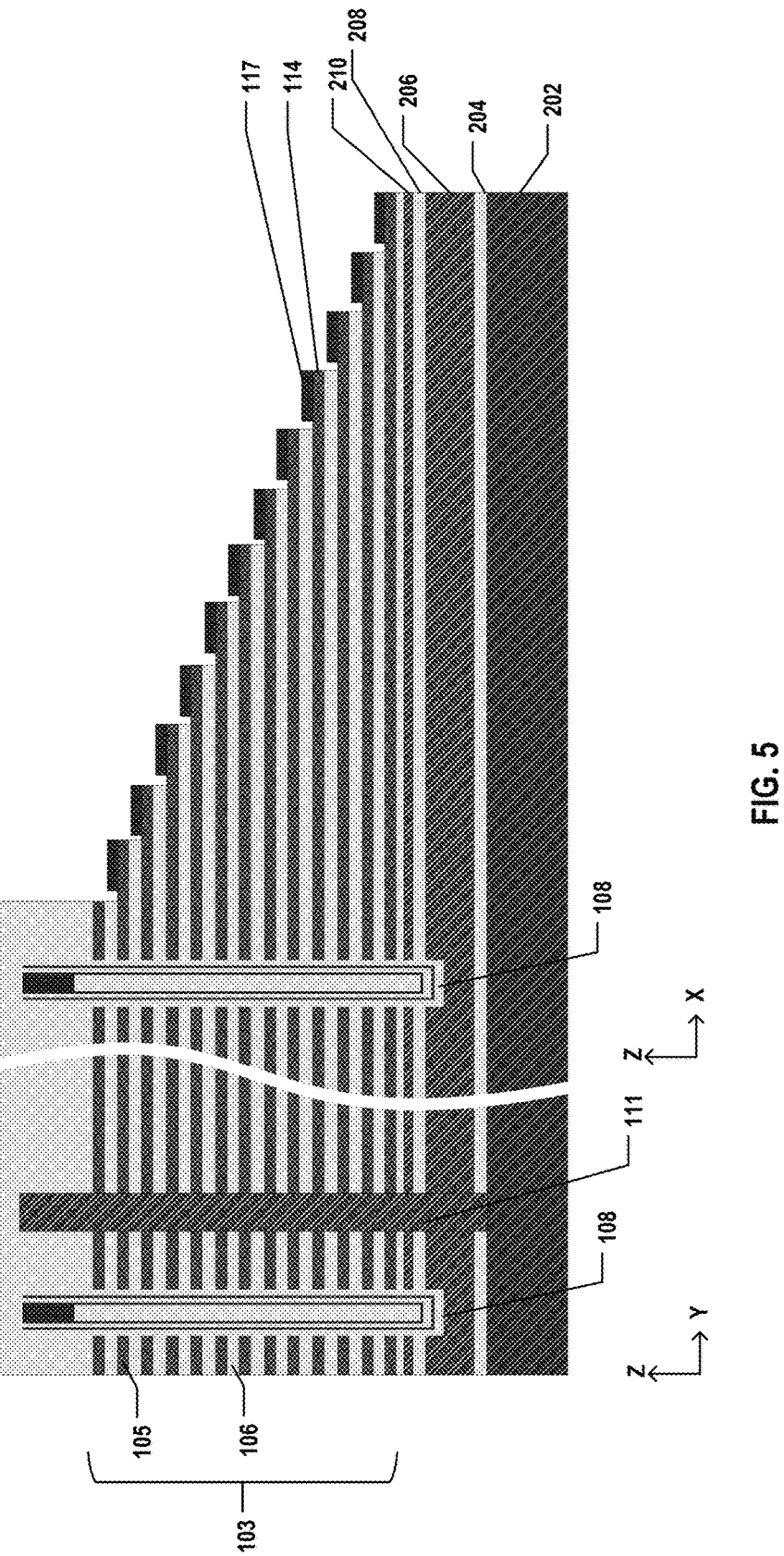

As shown in FIG. 5, after exposing the plurality of dielectric layers 105 at the outer region of dielectric stack 103, a stop layer 117 is formed on each dielectric layer 105 at the outer region of dielectric stack 103. In some implementations, stop layer 117 may include a semiconductor layer. In some implementations, stop layer 117 may include doped or undoped polysilicon. In some implementations, stop layer 117 may include silicon nitride. In some implementations, before forming stop layer 117, a contact layer, e.g., tungsten silicide (WSi2), may be formed on each dielectric layer 105 at the outer region of dielectric stack 103 to lower the contact resistance. In some implementations, stop layer 117 may be formed covering each dielectric layer 105, and then stop layer 117 outside the outer region of dielectric stack 103 is removed and stop layer 117 at the outer region of dielectric stack 103 is remained. Stop layer 117 may function as a stop layer when forming the contact structure openings from the upper side of 3D memory device 100 or forming the support structure openings from the bottom side of 3D memory device 100 in the later operations. As a result, the contact structures and the support structures can vertically align with each other.

Figure 6:
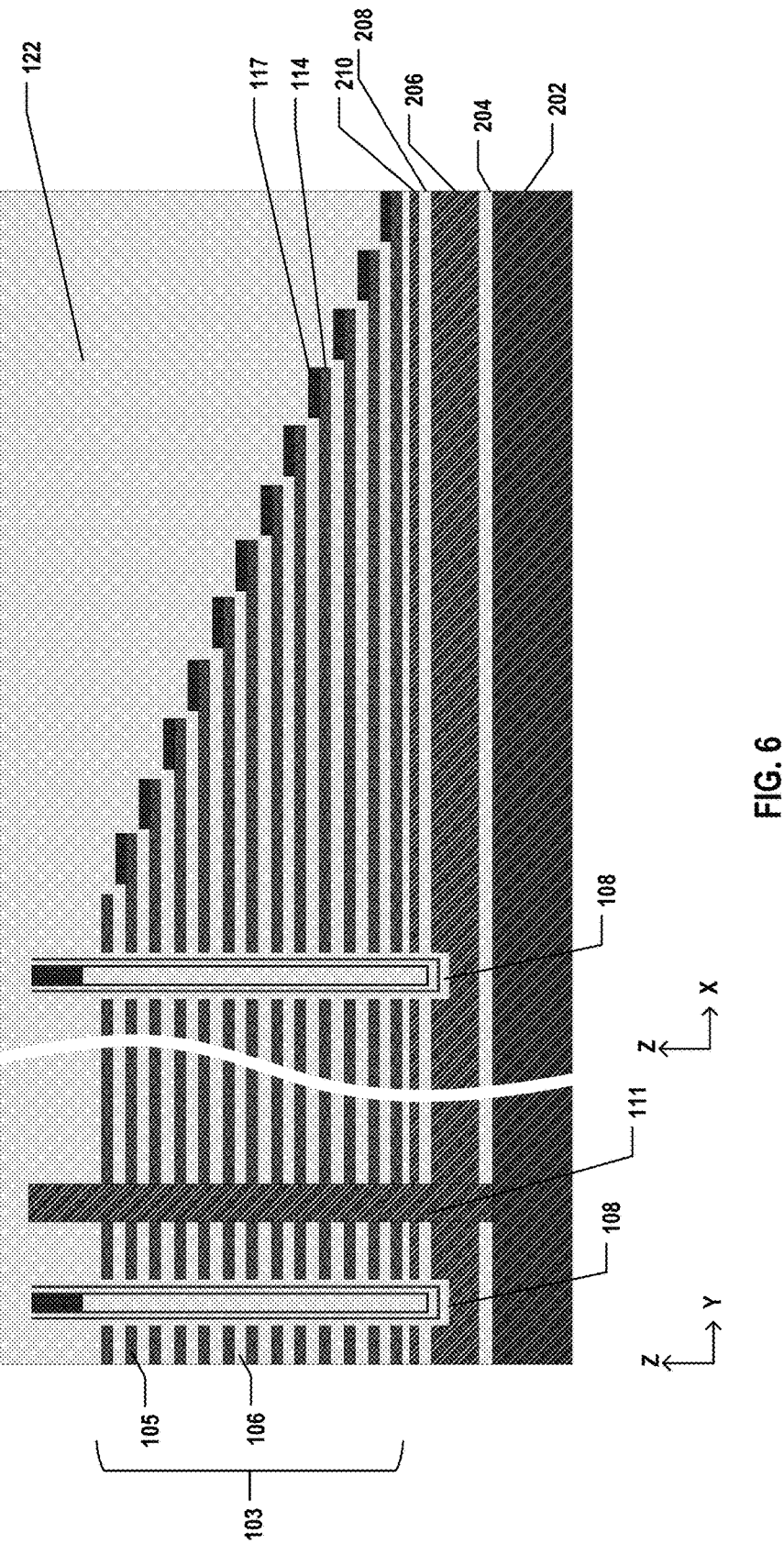

As shown in FIG. 6 and operation 1908 in FIG. 19, insulating structure 122 is formed over staircase structures 114. In some implementations, insulating structure 122 may be formed on the edge area of dielectric stack 103 of each level of staircase structures 114. In some implementations, the material of insulating structure 122 may be the same as dielectric layer 106. In some implementations, insulating structure 122 may include multiple dielectric materials and may be formed by multiple deposition operations. In some implementations, after the deposition operations, a planarization operation may be further performed to the top surface of insulating structure 122.

Figure 7:
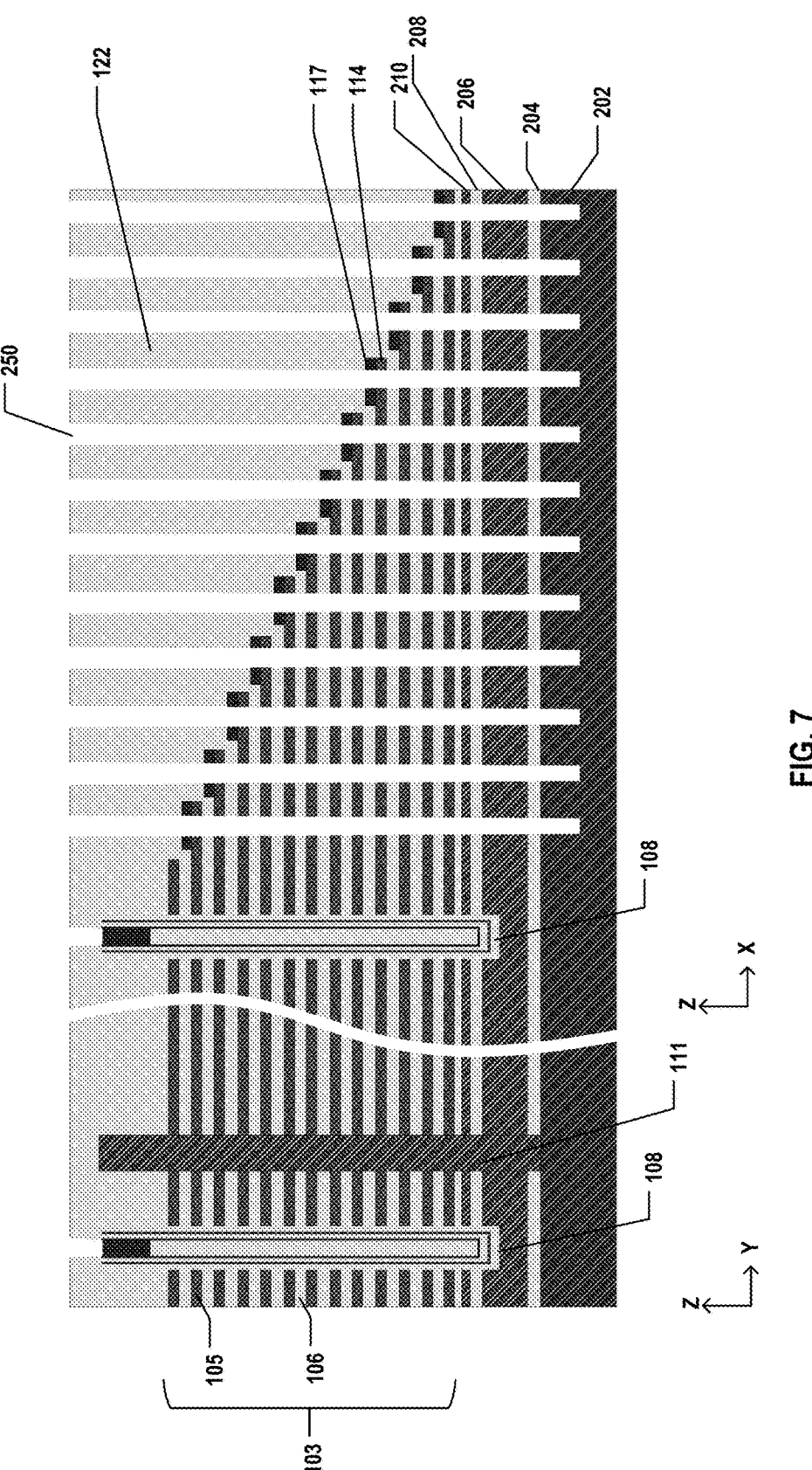

As shown in FIG. 7 and operation 1910 in FIG. 19, a plurality of openings 250 are formed in dielectric stack 103 and insulating structure 122. In some implementations, openings 250 are formed penetrating staircase structure 114 at the outer region of dielectric stack 103. In some implementations, openings 250 penetrate insulating structure 122, stop layer 117, and dielectric stack 103. In some implementations, openings 250 penetrate insulating structure 122, stop layer 117, dielectric stack 103, semiconductive layer 210, dielectric layer 208, semiconductive layer 206, and dielectric layer 204 to expose substrate 202.

In some implementations, openings 250 may be formed by using dry etch, wet etch, or other suitable processes. In some implementations, openings 250 may be formed by using plasma-enhanced etching operations. In some implementations, openings 250 may be formed by using plasma-enhanced etching operations having low selectivity to stop layer 117. In some implementations, openings 250 may be formed by using plasma-enhanced etching operations with CxFy or CHxFy gas, where x and y are integer values, such as $CF_4$ or $C_2F_6$.

Figure 8:
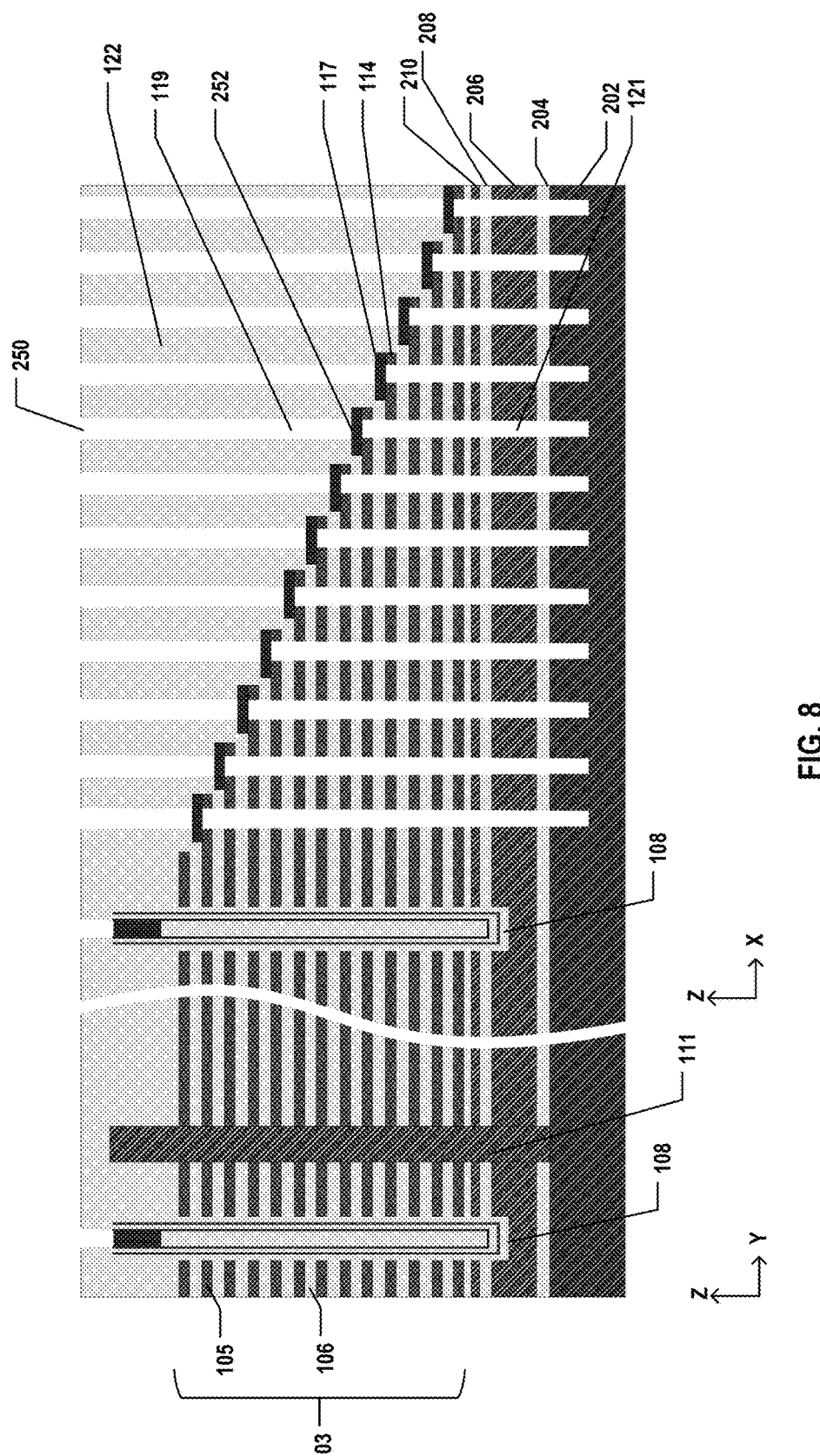

As shown in FIG. 8 and operation 1912 in FIG. 19, a blocking structure 252 is formed in each of openings 250. Blocking structure 252 may separate openings 250 into an upper portion and a lower portion. In some implementations, blocking structure 252 may be formed by performing a selective epitaxial growth (SEG) operation on stop layer 117 exposed by openings 250. In some implementations, an SEG pre-cleaning process may be performed to clean the sidewalls of openings 250, and then the SEG operation may be performed to form blocking structure 252 on stop layer 117 exposed by openings 250. In some implementations, blocking structure 252 and stop layer 117 may be formed by the same material. In some implementations, blocking structure 252 may be formed by polysilicon.

In some implementations, an oxidation operation may be performed on the surface of stop layer 117 exposed by openings 250 to form blocking structure 252 on stop layer 117. In some implementations, the oxidation operation may oxidate the surface of stop layer 117 exposed by openings 250. In some implementations, blocking structure 252 may be formed by silicon oxide.

As shown in FIG. 8, after forming blocking structure 252, each opening 250 is separated into the upper portion and the lower portion. Since blocking structure 252 is formed on the exposed surface of stop layer 117 along the x-direction and the y-direction and stop layer is formed at the edges of dielectric stack 103 in staircase structures 114, blocking structure 252 may define the position and length of a plurality of contact structure openings 119 above blocking structure 252 and a plurality of support structure openings 121 below blocking structure 252. Contact structure openings 119 and support structure openings 121 extend along the z-direction. In other words, contact structure openings 119 are formed in insulating structure 122, and support structure openings 121 are formed in dielectric stack 103.

Figure 9:
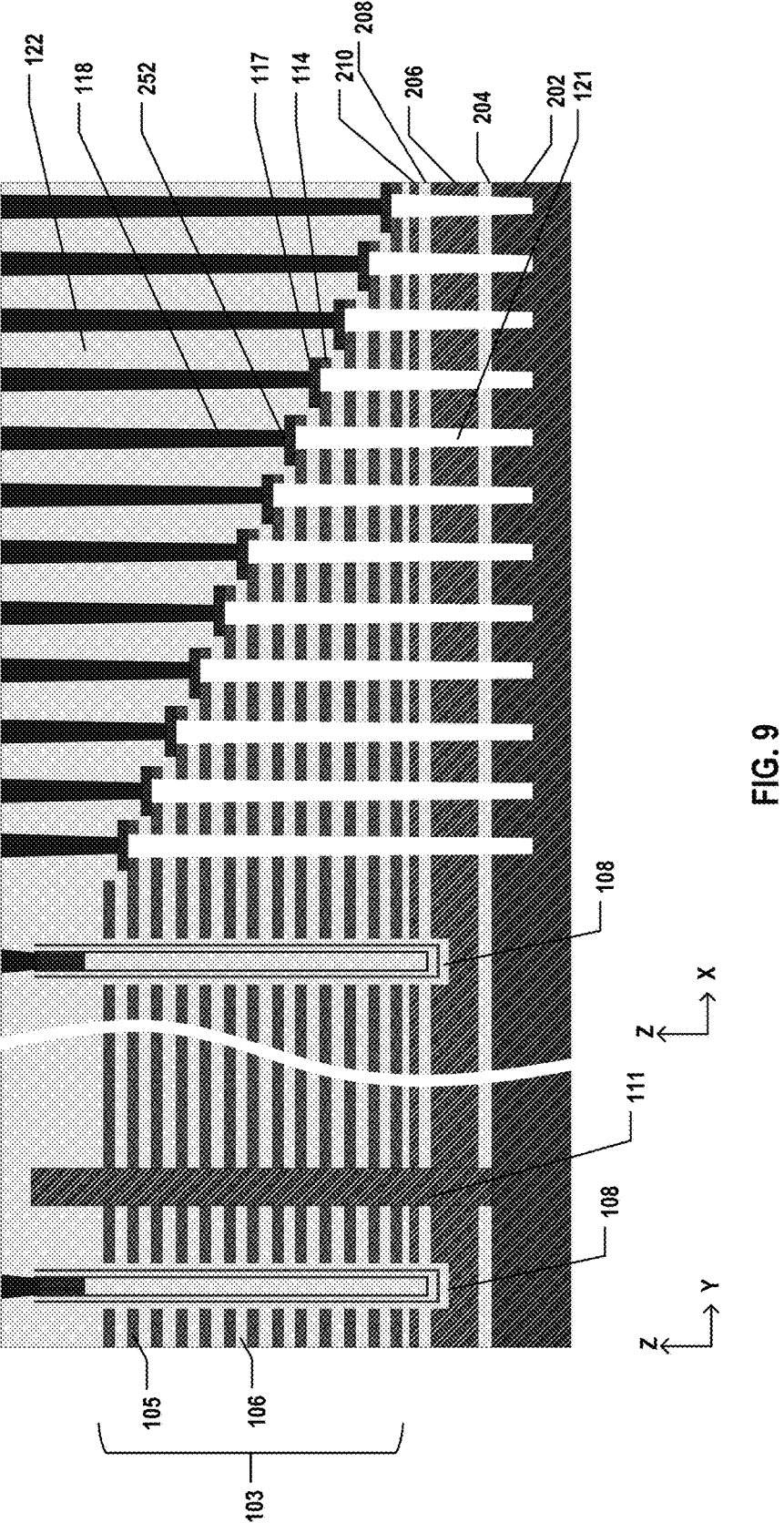

As shown in FIG. 9 and operation 1914 in FIG. 19, contact structures 118 are formed in contact structure openings 119. In other words, contact structures 118 are formed in openings 250 above blocking structure 252. Each contact structure 118 is in contact with blocking structure 252. In some implementations, contact structures 118 may be formed in contact structure openings 119 by using CVD, PVD, ALD, or other suitable processes. In some implementations, contact structure 118 may include conductive materials including, but not limited to, W, Co, Cu, Al, polysilicon, doped silicon, silicides, or any combination thereof.

Figure 10:
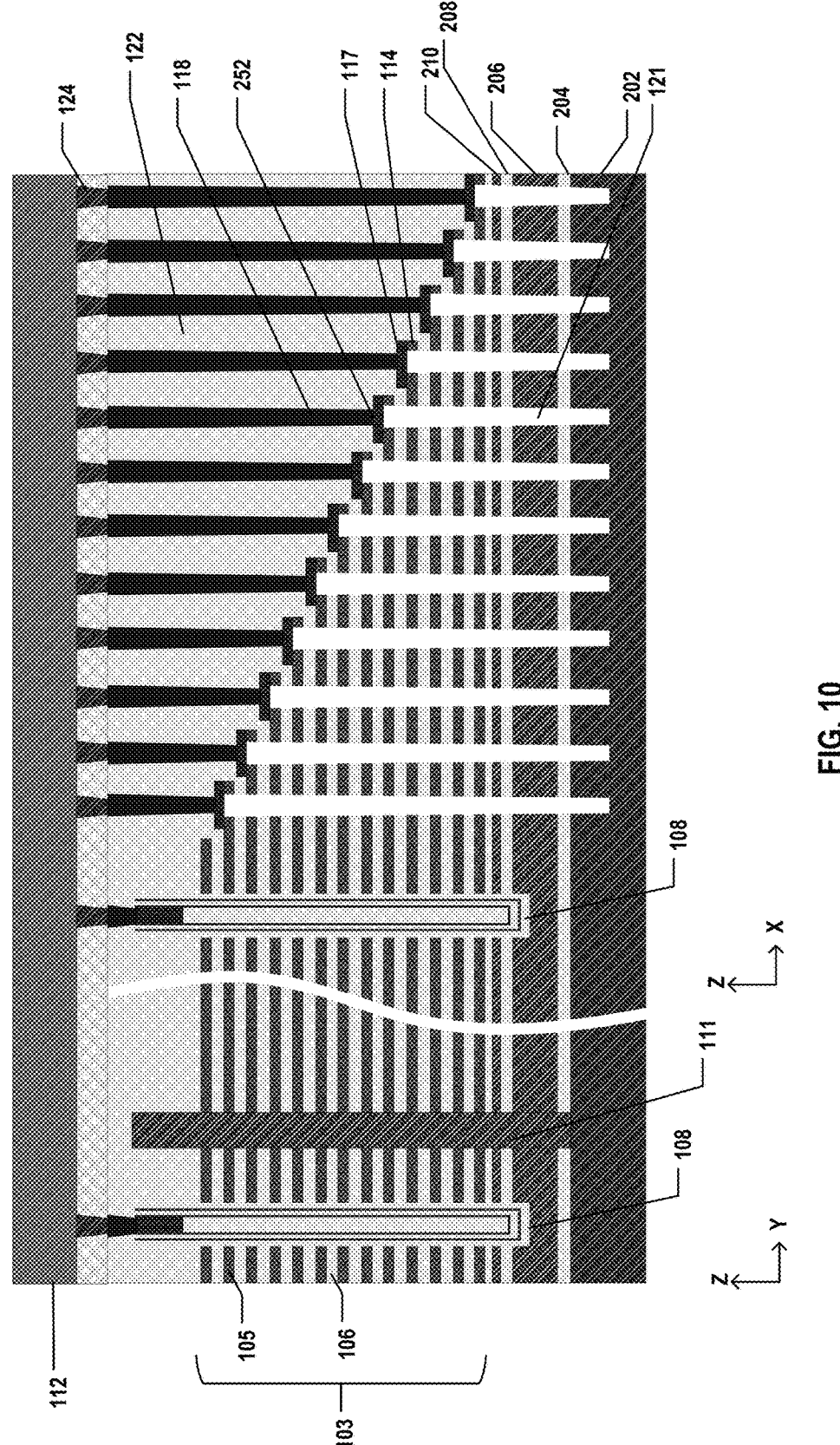

Then, as shown in FIG. 10, peripheral device 112 is formed on dielectric stack 103 in electric contact with channel structures 108 and contact structures 118. In some implementations, peripheral device 112 may be formed separately on another substrate and be boned on dielectric stack 103. In some implementations, when dielectric stack 103 is flipped over, peripheral device 112 may be located under dielectric stack 103. As described above in FIG. 2, contact structures 118 may be arranged in multiple rows, and only a portion of the rows of contact structures 118 is in contact with peripheral device 112 through peripheral contacts 124.

Figure 11:
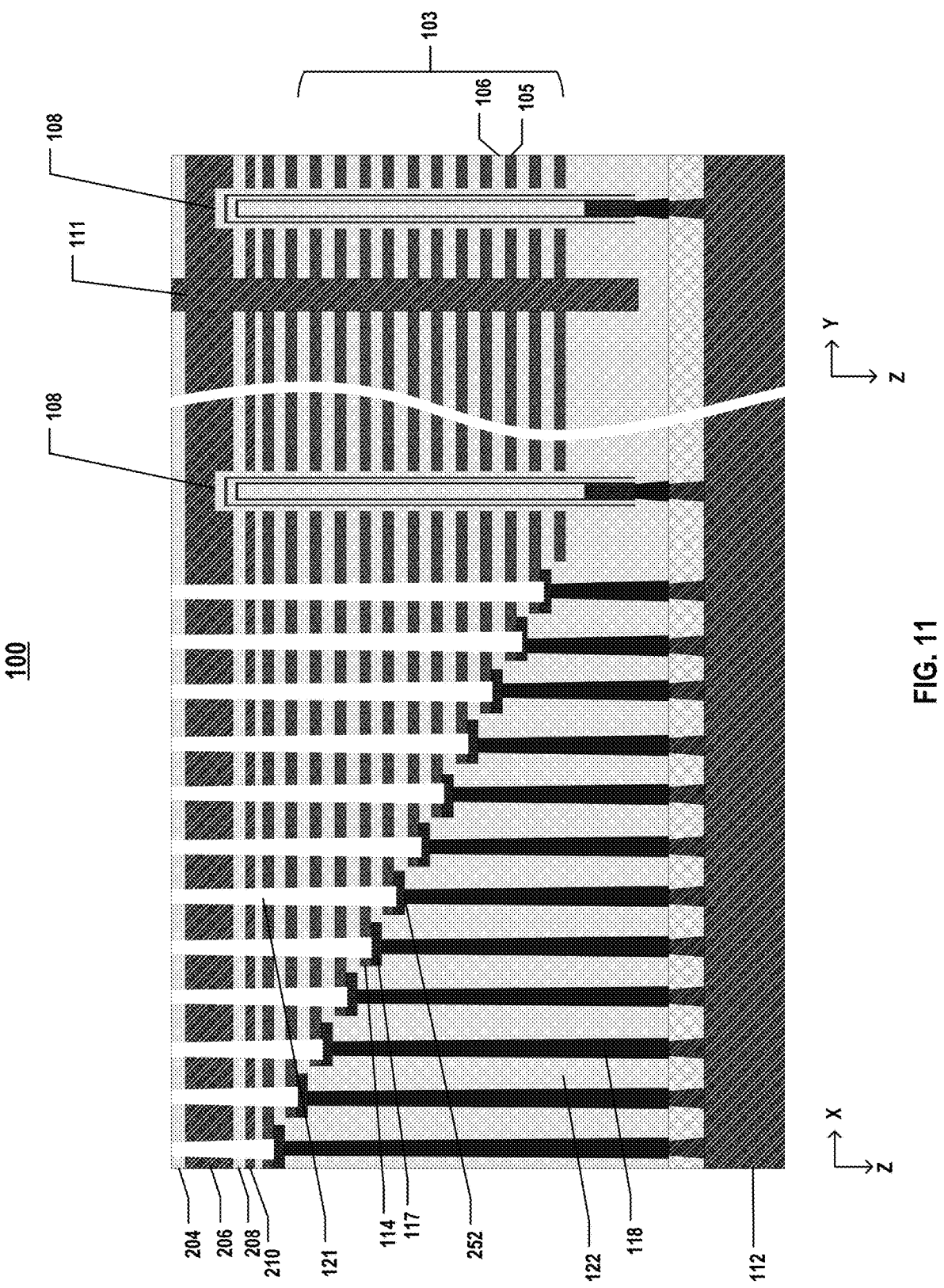

After bonding peripheral device 112 with dielectric stack 103, the whole structure of 3D memory device 100 may be flipped over, and a subtract removal operation may be performed, as shown in FIG. 11. In some implementations, substrate 202 may be thinned and removed. In some implementations, a chemical-mechanical polishing (CMP) process may be performed to thin substrate 202, and a etch process may be then performed to remove substrate 202. In some implementations, substrate 202 may be removed by multiple removal operations, such as the wet etch, dry etching, or other suitable processes, until being stopped by dielectric layer 204. In some implementations, substrate 202 may be peeled off After the removal of substrate 202, support structure openings 121 are exposed.

Figure 12:
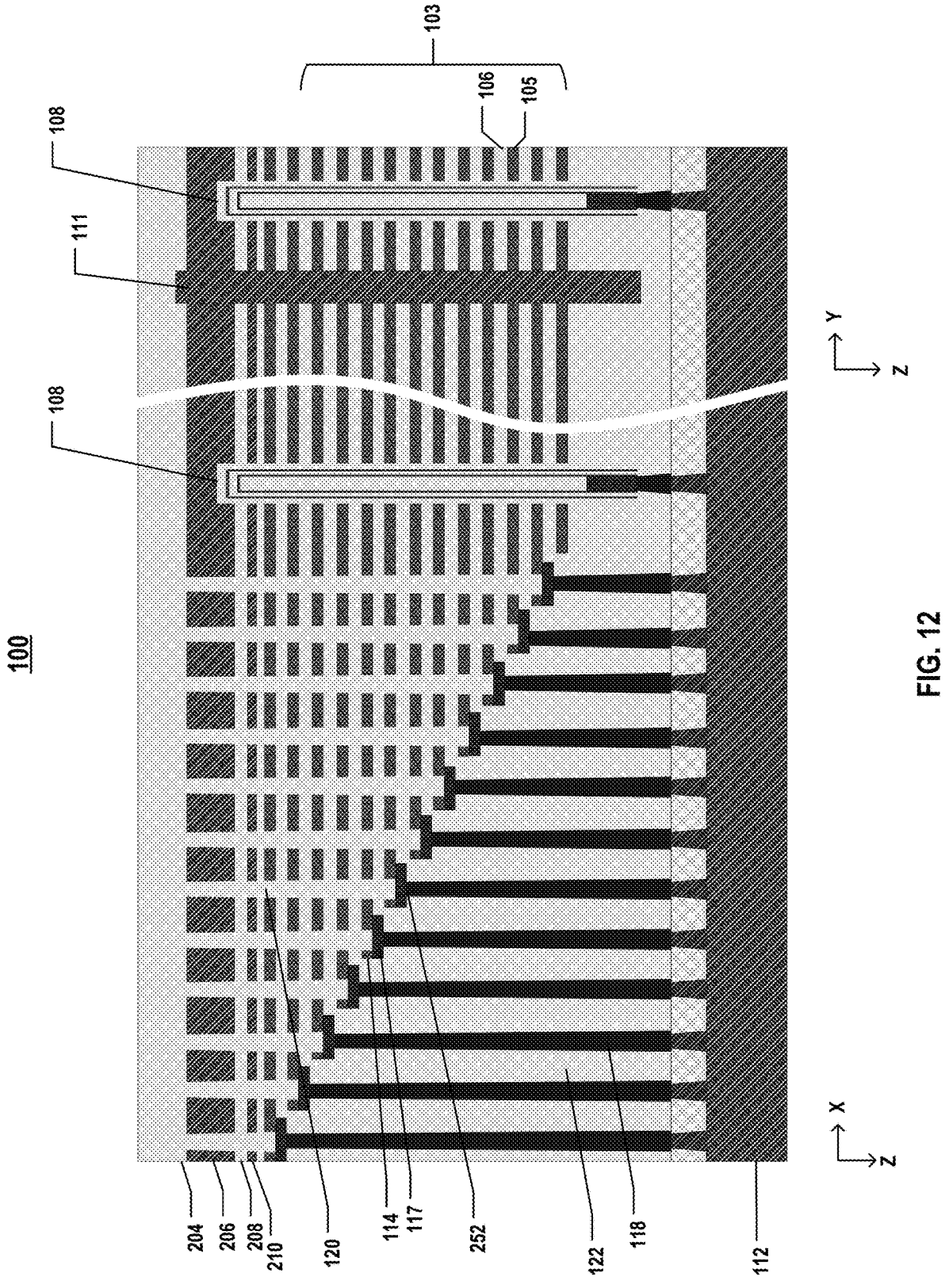

As shown in FIG. 12 and operation 1916 in FIG. 19, support structures 120 are formed in support structure openings 121. In other words, support structures 120 are formed in openings 250 below blocking structure 252. In some implementations, support structures 120 may be formed in support structure openings 121 by using CVD, PVD, ALD, or other suitable processes. In some implementations, support structures 120 may include dielectric materials. In some implementations, support structures 120 may include silicon oxide.

Figure 13:
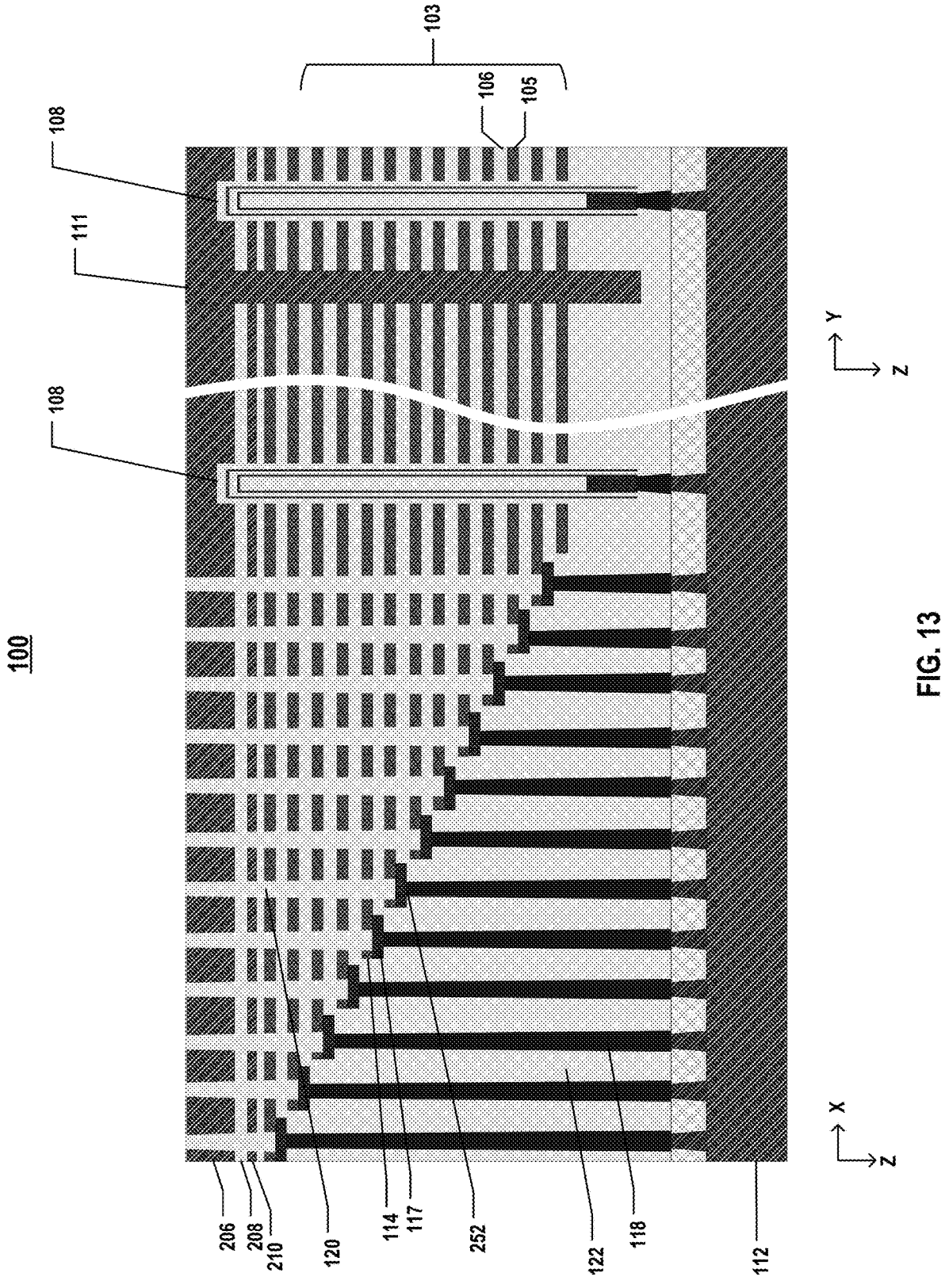

As shown in FIG. 13, the top portion of support structures 120 and dielectric layer 204 are then removed. In some implementations, the top portion of support structures 120 and dielectric layer 204 may be removed by CMP, dry etch, wet etch, or other suitable processes. After the removal operation, sacrificial structure 111 and semiconductive layer 206 are exposed.

Figure 14:
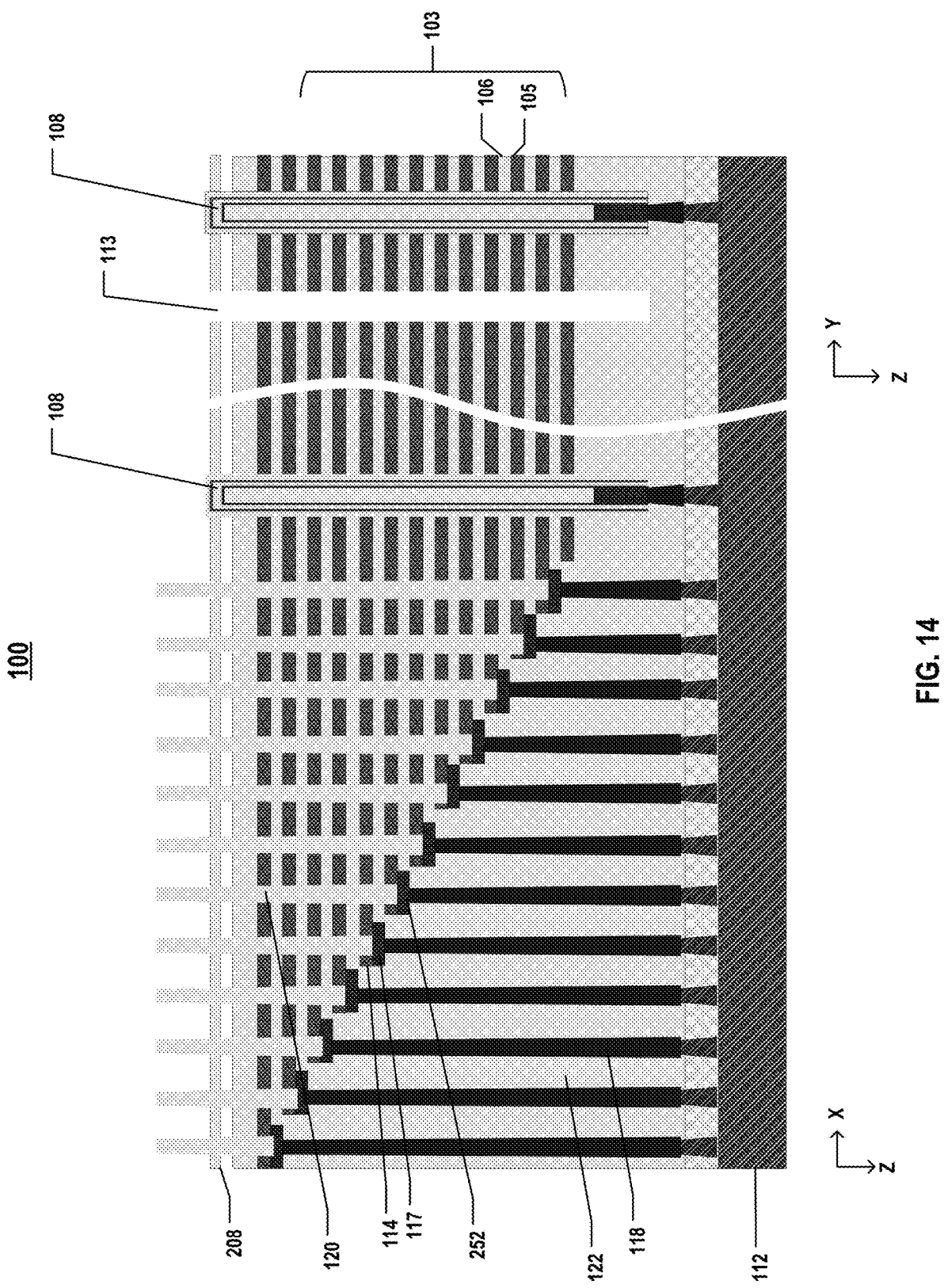

As shown in FIG. 14 and operation 1918 in FIG. 19, sacrificial structure 111 is removed to form a slit opening 113. In some implementations, sacrificial structure 111, semiconductive layer 206, and semiconductive layer 210 may be formed by the same material and may be removed together. In some implementations, sacrificial structure 111, semiconductive layer 206, and semiconductive layer 210 are formed by polysilicon and are removed together. In some implementations, sacrificial structure 111 may be removed by dry etch, wet etch, or other suitable processes. After removing semiconductive layer 206, the end portion of channel structures 108 is exposed.

Figure 16:
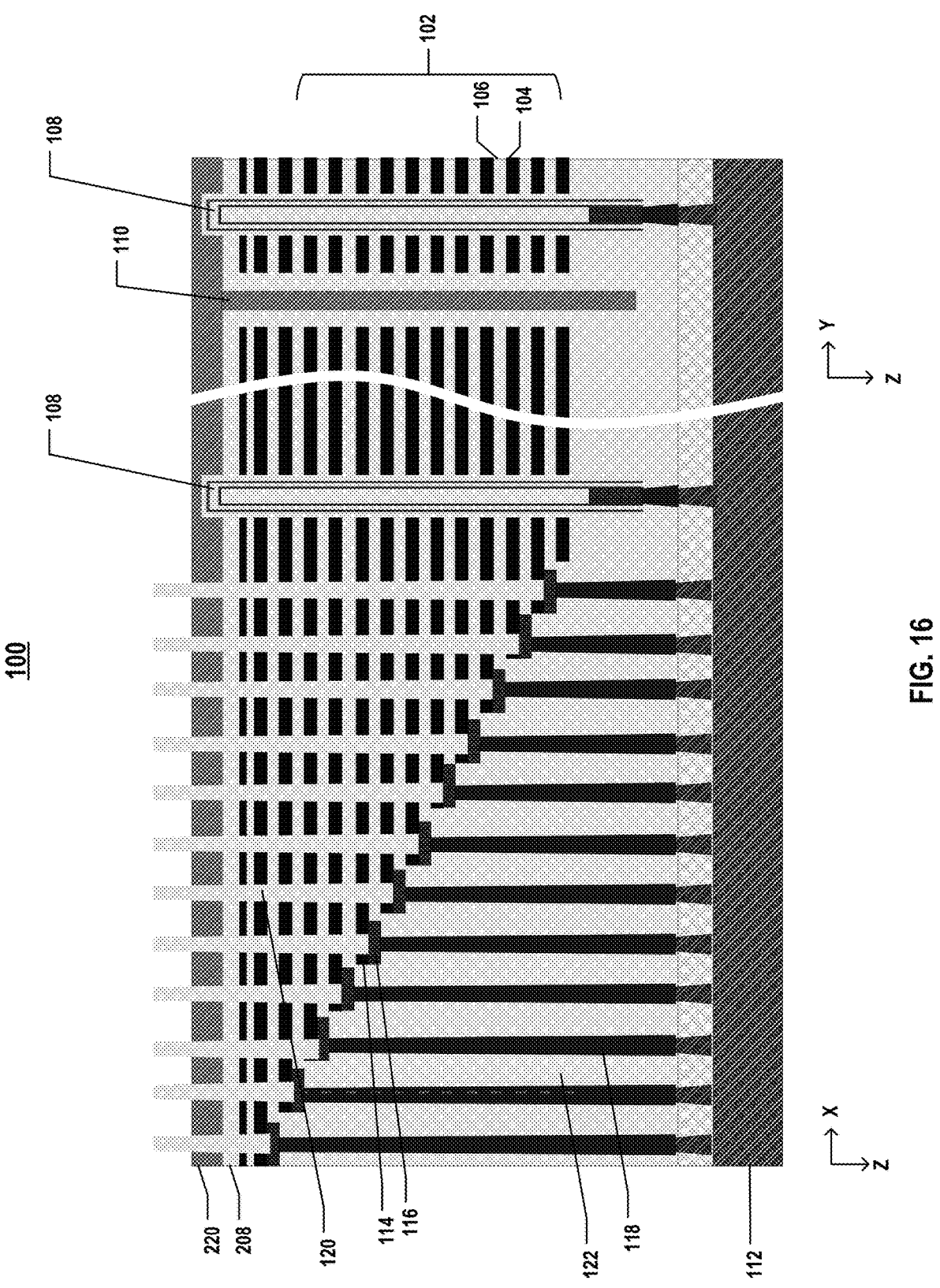

As shown in FIG. 16 and operation 1920 in FIG. 19, dielectric layers 105 are replaced with conductive layers 104 (the word lines) through slit opening 113. In some implementations, dielectric layers 105 may be removed by dry etch, wet etch, or other suitable processes to form a plurality of cavities. The word lines may be formed in the cavities by sequentially deposing the gate dielectric layer made from high-k dielectric materials, the adhesion layer including titanium/titanium nitride (Ti/TiN) or tantalum/tantalum nitride (Ta/TaN), and the gate conductive made from tungsten. After the word line replacement operation, memory stack 102 is formed.

Figure 15:
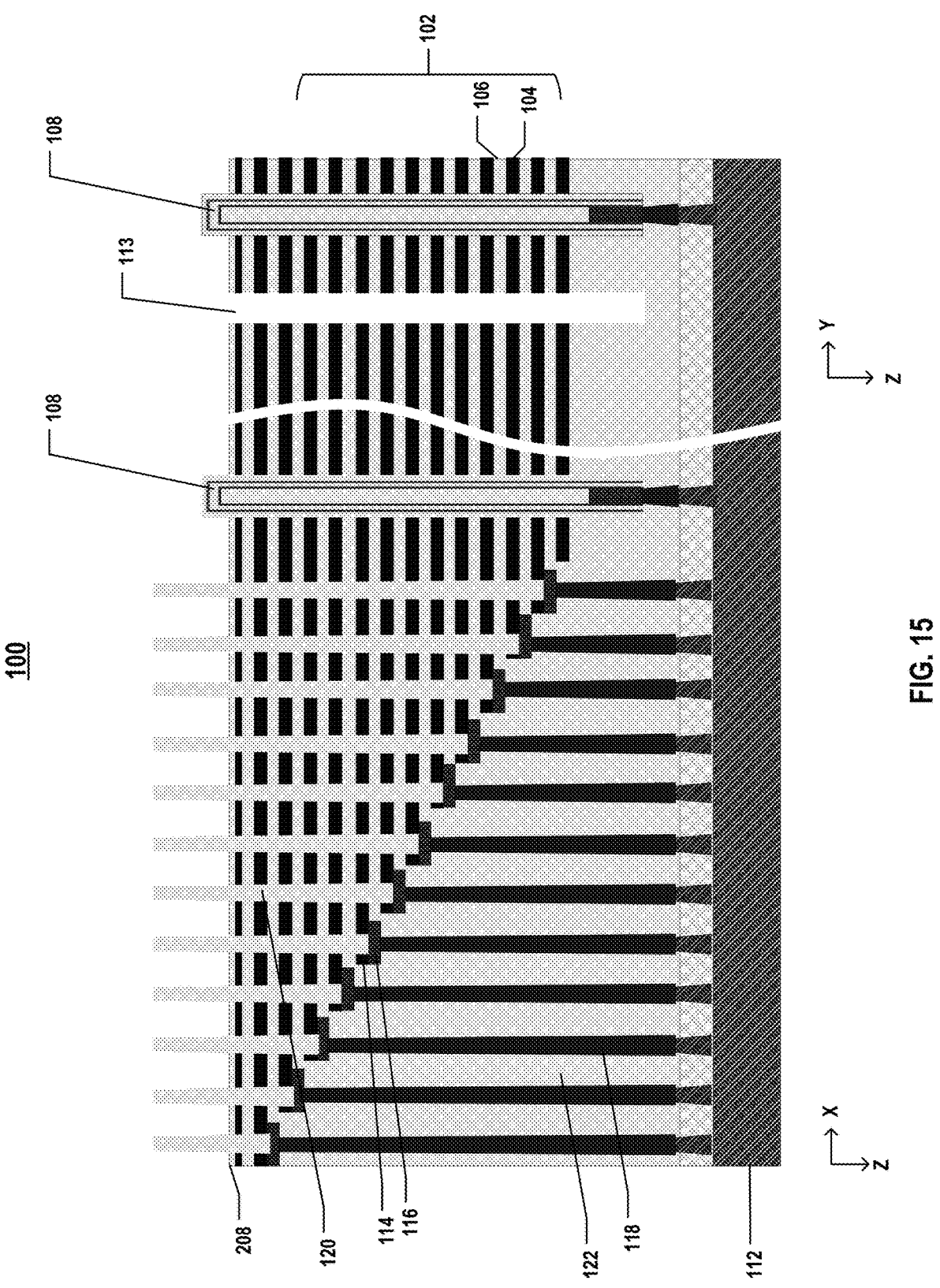

In the word line replacement operation, dielectric layers 105, blocking structure 252, and stop layer 117 are removed. In some implementations, dielectric layers 105, blocking structure 252, and stop layer 117 include the same material and can be removed together. In some implementations, dielectric layers 105, blocking structure 252, and stop layer 117 can be removed by multiple etch processes. After the word line replacement operation, staircase contact 116 may be formed on the landing area of the word lines. In some implementations, staircase contact 116 may include conductive materials including, but not limited to, W, Co, Cu, Al, polysilicon, doped silicon, silicides, or any combination thereof. In some implementations, the thickness of staircase contact 116 may be equal to or similar to the thickness of stop layer 117. In some implementations, the total thickness of staircase contact 116 and conductive layer 104 in the landing area may be greater than other areas, as shown in FIG. 15. After the word line replacement operation, contact structures 118 can be electrically coupled to the word lines (conductive layer 104) in the landing area through staircase contacts 116.

As shown in FIG. 16 and operation 1922 in FIG. 19, slit structure 110 is formed in slit opening 113. Slit structure 110 may extend vertically along the z-direction through memory stack 102 and may also extend laterally along the x-direction to separate memory stack 102 into multiple fingers. In some implementations, slit structures 110 may be formed by using CVD, PVD, ALD, or other suitable processes. In some implementations, slit structures 110 may include a slit contact, formed by filling slit opening 113 with conductive materials including but not limited to, W, Co, Cu, Al, polysilicon, silicides, or any combination thereof. Slit structures 110 may further include a composite spacer disposed laterally between the slit contact and conductive layers 104 and dielectric layers 106 to electrically insulate the gate line slit structure from surrounding conductive layers 104 (the gate conductive layer in memory stacks). In some implementations, slit structures 110 may include dielectric materials when the slit contact is not required in 3D memory device 100. When forming slit structure 110, a first semiconductive layer 220 may also be formed covering memory stack 102.

Figure 17:
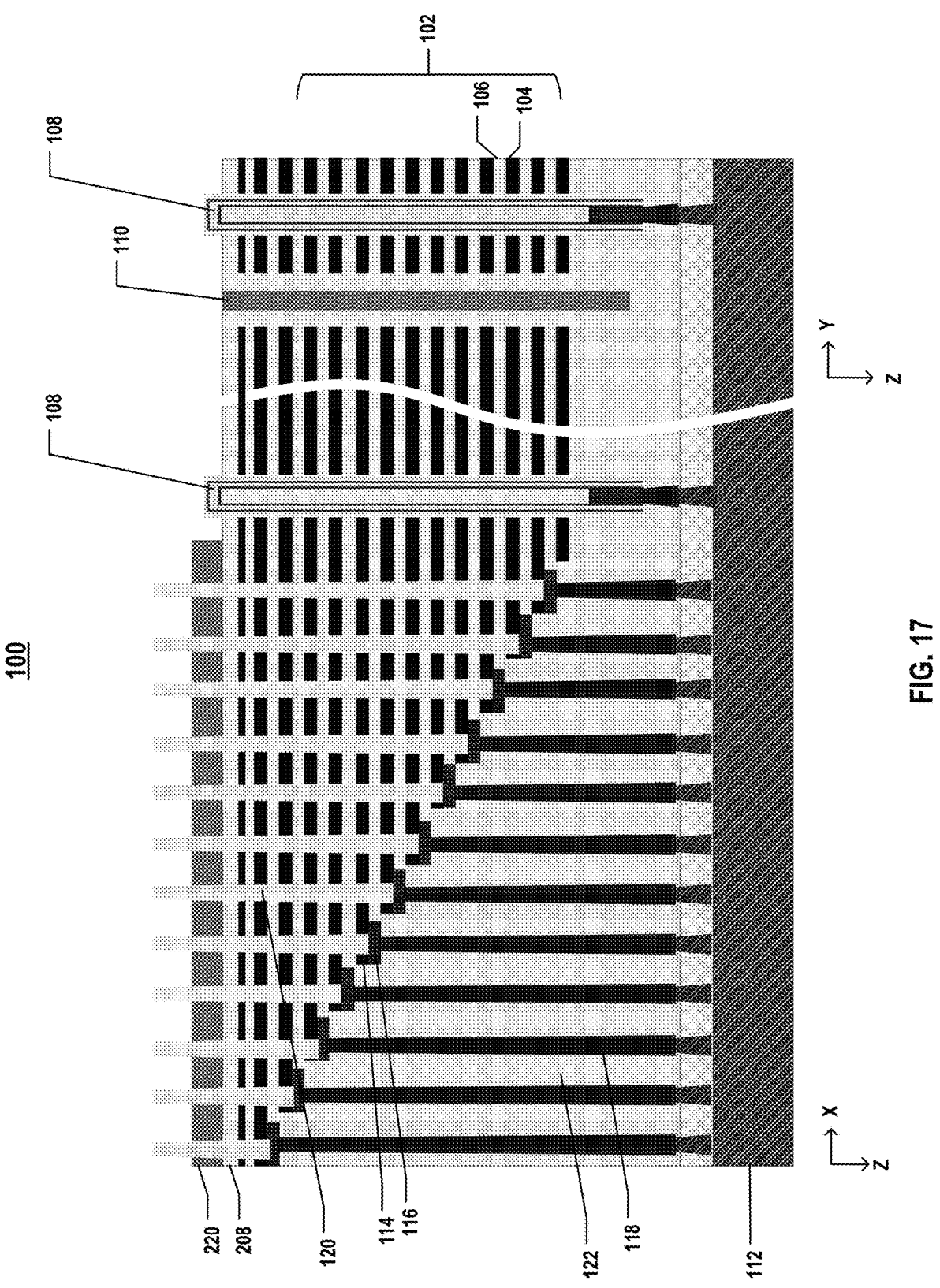
Figure 18:
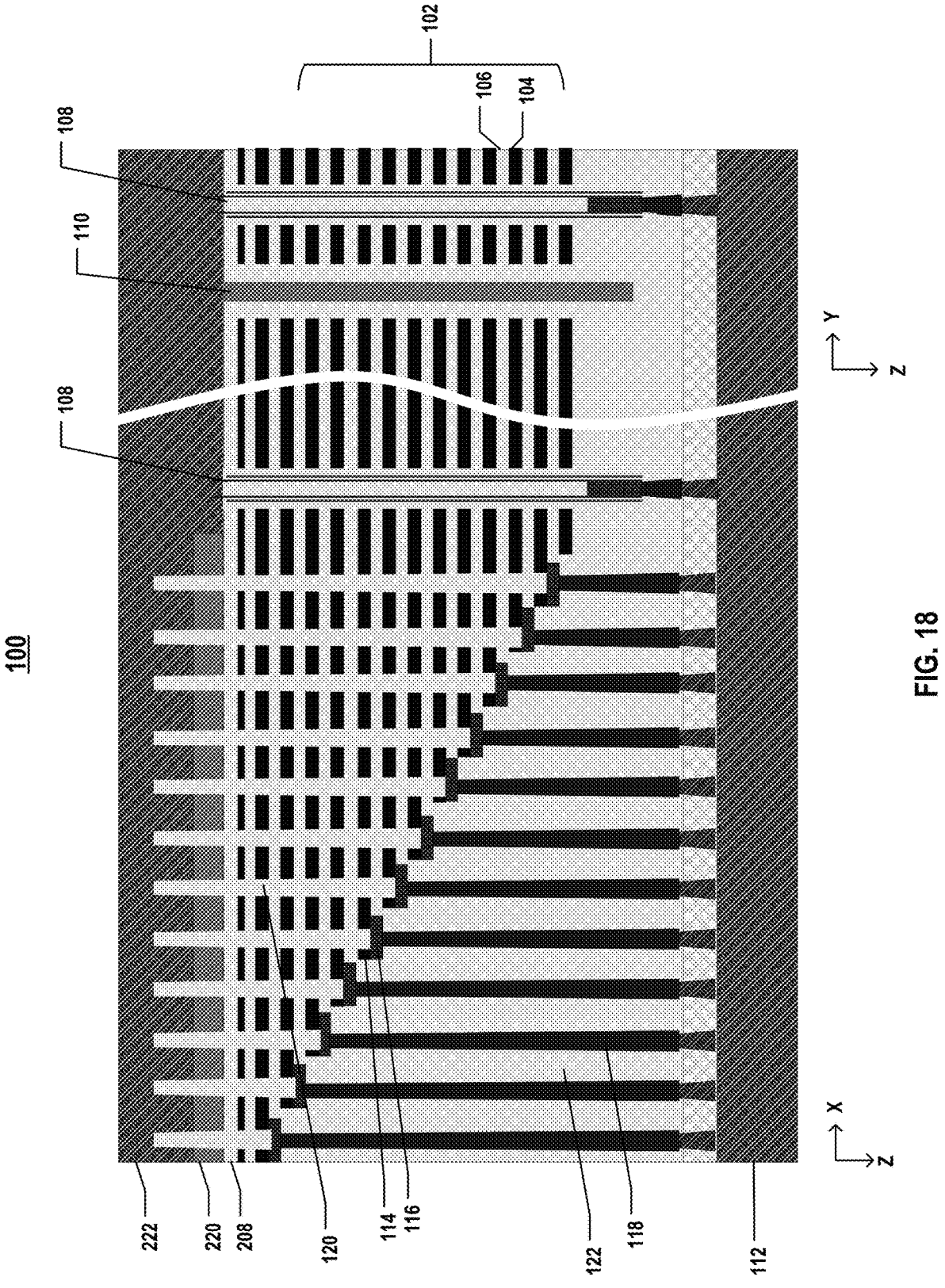

As shown in FIG. 17, first semiconductive layer 220 covering channel structures 108 (the core area) is removed to expose the end of channel structures 108. Then, an implantation operation may be performed on the end of channel structures 108. As shown in FIG. 18, a second semiconductive layer 222 is formed covering the core area and first semiconductive layer 220. In some implementations, second semiconductive layer 222 may be polysilicon. In some implementations, second semiconductive layer 222 may be doped polysilicon. In some implementations, second semiconductive layer 222 may be n-type doped polysilicon. In some implementations, an anneal operation may be further performed on second semiconductive layer 222.

By forming support structures 120 vertically aligning contact structures 118 and forming contact structures 118 and support structures 120 through opposite sides of 3D memory device 100, the supporting strength during the manufacturing processes can be improved. In addition, the space window for the contact landing design can be increased. Hence, the number of 3D memory layers and the size of 3D memory device 100 can be taken into consideration together without conflict.

Figure 20:
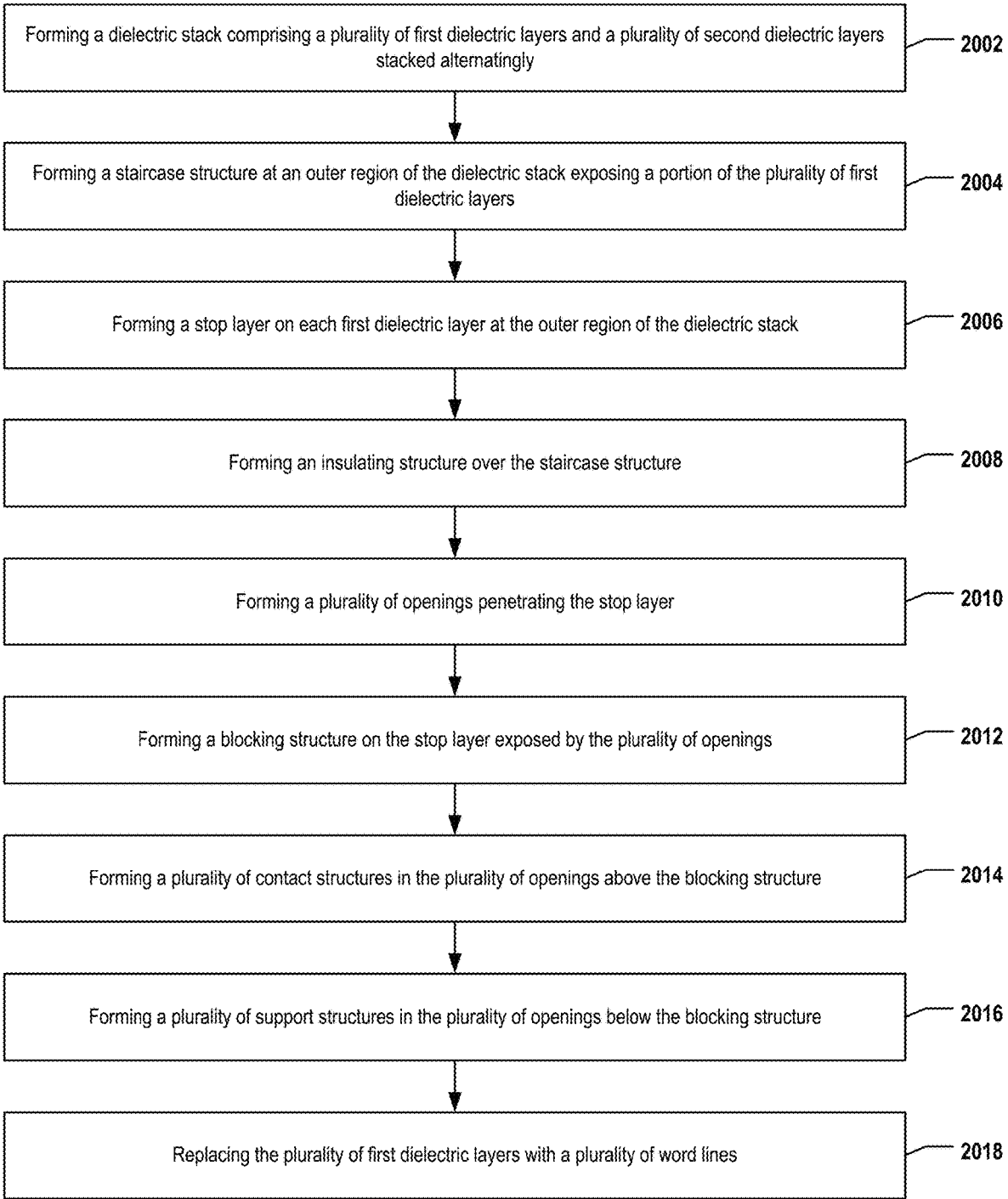
FIG. 20 illustrates a flowchart of another exemplary method for forming a 3D memory device, according to some aspects of the present disclosure.

FIG. 20 illustrates a flowchart of a method 2000 for forming 3D memory device 100, according to some aspects of the present disclosure. For the purpose of better describing the present disclosure, the cross-sections of 3D memory device 100 in FIGS. 3-18 and method 2000 in FIG. 20 will be discussed together. It is understood that the operations shown in method 2000 are not exhaustive and that other operations may be performed as well before, after, or between any of the illustrated operations. Further, some of the operations may be performed simultaneously, or in a different order than shown in FIGS. 3-18 and FIG. 20.

As shown in FIG. 3 and operation 2002 in FIG. 20, dielectric stack 103 is formed. Dielectric stack 103 includes dielectric layers 105 and dielectric layers 106 stacked alternatingly. In some implementations, dielectric layer 204 is formed on substrate 202, and semiconductive layer 206 is formed on dielectric layer 204. In some implementations, substrate 202 may be a doped semiconductive layer. In some implementations, substrate 202 may be a silicon substrate. In some implementations, dielectric layer 204 may include a layer of silicon oxide. In some implementations, semiconductive layer 206 may include a doped or undoped polysilicon layer. In some implementations, dielectric layer 204 and semiconductive layer 206 may be sequentially deposited by one or more thin film deposition processes including, but not limited to, CVD, PVD, ALD, or any combination thereof. In some implementations, dielectric layer 208 and semiconductive layer 210 may be formed on semiconductive layer 206. In some implementations, dielectric layer 208 may include silicon oxide, and semiconductive layer 210 may include a doped or undoped polysilicon layer. In some implementations, semiconductive layer 206 and semiconductive layer 210 may include the same material. In some implementations, dielectric layer 208 may function as a stop layer when removing semiconductive layer 206 from the backside of 3D memory device 100 in later operations. In some implementations, semiconductive layer 210 may function as a stop layer when removing a bottom portion of the channel structure from the backside of 3D memory device 100 in later operations. In some implementations, dielectric layer 204, semiconductive layer 206, dielectric layer 208, and semiconductive layer 210 may be sequentially deposited by one or more thin film deposition processes including, but not limited to, CVD, PVD, ALD, or any combination thereof.

Dielectric stack 103 is formed on semiconductive layer 210. Dielectric stack 103 may include dielectric layers 105 and dielectric layers 106 stacked alternatingly. The dielectric layer pairs, including dielectric layers 105 and dielectric layers 106, may extend along the x-direction and the y-direction. In some implementations, each dielectric layer 106 may include a layer of silicon oxide, and each dielectric layer 105 may include a layer of silicon nitride. The dielectric layer pairs may be formed by one or more thin film deposition processes including, but not limited to, CVD, PVD, ALD, or any combination thereof.

In some implementations, channel structures 108 and sacrificial structure 111 are formed in dielectric stack 103 extending vertically along the z-direction. In some implementations, the channel hole is formed in dielectric stack 103 extending vertically along the z-direction. In some implementations, the channel hole may extend to semiconductive layer 206 and expose semiconductive layer 206. In some implementations, fabrication processes for forming the channel hole may include wet etching and/or dry etching, such as DRIE. Then, channel structures 108 are formed in the channel hole. Channel structures 108 may extend vertically through dielectric stack 103. In some implementations, channel structure 108 may be a pillar-shaped structure.

Each channel structure 108 may include memory film 214 and semiconductive channel 212. In some implementations, channel structure 108 may also include a dielectric core in the center of channel structure 108. In some implementations, memory film 214 is a composite layer including a tunneling layer, a storage layer (also known as a "charge trap layer"), and a blocking layer.

The dielectric core, semiconductive channel 212, and memory film 214 (including the tunneling layer, the storage layer, and the blocking layer) are arranged radially from the center toward the outer surface of the pillar in this order, according to some implementations. In some implementations, the tunneling layer may include silicon oxide, silicon oxynitride, or any combination thereof. In some implementations, the storage layer may include silicon nitride, silicon oxynitride, silicon, or any combination thereof. In some implementations, the blocking layer may include silicon oxide, silicon oxynitride, high dielectric constant (high-k) dielectrics, or any combination thereof. In one example, memory film 214 may include a composite layer of silicon oxide/silicon oxynitride (or silicon nitride)/silicon oxide (ONO). In some implementations, a high-k dielectric layer may be further formed between dielectric stack 103 and the blocking layer.

In some implementations, a sacrificial structure opening may be formed in dielectric stack 103 extending vertically along the z-direction. In some implementations, the sacrificial structure opening may extend to substrate 202 and expose substrate 202. In some implementations, fabrication processes for forming the sacrificial structure opening may include wet etching and/or dry etching, such as DRIE. Then, sacrificial structure 111 is formed in the sacrificial structure opening. In some implementations, sacrificial structure 111 may include polysilicon.

As shown in FIG. 4 and operation 2004 in FIG. 20, staircase structure 114 is formed at the outer region of dielectric stack 103 exposing a portion of dielectric layers 105. In some implementations, the outer region of dielectric stack 103 may include multiple staircase structures 114. The corresponding edges of dielectric stack 103 along the vertical direction away from the bottom of dielectric stack 103 (the positive z-direction) can be staggered laterally toward channel structure 108. In other words, the edges of dielectric stack 103 in staircase structures 114 can be tilted toward the inner region of dielectric stack 103. In some implementations, the length of the dielectric layer pairs increases from the top to the bottom.

In some implementations, the top layer in each level of staircase structure 114 (e.g., each dielectric layer pair in FIG. 4) is dielectric layer 105. After dielectric layer 105 is replaced by the conductive layers in the later operations, staircase structure 114 may be the word line fan-out. In some implementations, the formation of staircase structure 114 may include multiple etch operations.

As shown in FIG. 5 and operation 2006 in FIG. 20, stop layer 117 is formed on each dielectric layer 105 at the outer region of dielectric stack 103. In some implementations, stop layer 117 may include doped or undoped polysilicon. In some implementations, stop layer 117 may include silicon nitride. In some implementations, before forming stop layer 117, a contact layer, e.g., tungsten silicide (WSi2), may be formed on each dielectric layer 105 at the outer region of dielectric stack 103 to lower the contact resistance. Stop layer 117 may function as a stop layer when forming the contact structure openings from the upper side of 3D memory device 100 or forming the support structure openings from the bottom side of 3D memory device 100 in the later operations. As a result, the contact structures and the support structures can vertically align with each other.

As shown in FIG. 6 and operation 2008 in FIG. 20, insulating structure 122 is formed over staircase structure 114. In some implementations, insulating structure 122 may be formed on the edge area of dielectric stack 103 of each level of staircase structures 114. In some implementations, the material of insulating structure 122 may be the same as dielectric layer 106. In some implementations, insulating structure 122 may include multiple dielectric materials and may be formed by multiple deposition operations. In some implementations, after the deposition operations, a planarization operation may be further performed to the top surface of insulating structure 122.

Then, as shown in FIG. 7 and operation 2010 in FIG. 20, openings 250 are formed in dielectric stack 103 and insulating structure 122. In some implementations, openings 250 are formed penetrating staircase structure 114 at the outer region of dielectric stack 103. In some implementations, openings 250 penetrate insulating structure 122, stop layer 117, and dielectric stack 103. In some implementations, openings 250 penetrate insulating structure 122, stop layer 117, dielectric stack 103, semiconductive layer 210, dielectric layer 208, semiconductive layer 206, and dielectric layer 204 to expose substrate 202.

In some implementations, openings 250 may be formed by using dry etch, wet etch, or other suitable processes. In some implementations, openings 250 may be formed by using plasma-enhanced etching operations. In some implementations, openings 250 may be formed by using plasma-enhanced etching operations having low selectivity to stop layer 117. In some implementations, openings 250 may be formed by using plasma-enhanced etching operations with CxFy or CHxFy gas, where x and y are integer values, such as $CF_4$ or $C_2F_6$.

As shown in FIG. 8 and operation 2012 in FIG. 20, blocking structure 252 is formed in each of openings 250. Blocking structure 252 may separate openings 250 into an upper portion and a lower portion. In some implementations, blocking structure 252 may be formed by performing an SEG operation on stop layer 117 exposed by openings 250. In some implementations, an SEG pre-cleaning process may be performed to clean the sidewalls of openings 250, and then the SEG operation may be performed to form blocking structure 252 on stop layer 117 exposed by openings 250. In some implementations, blocking structure 252 and stop layer 117 may be formed by the same material. In some implementations, blocking structure 252 may be formed by polysilicon.

In some implementations, an oxidation operation may be performed on the surface of stop layer 117 exposed by openings 250 to form blocking structure 252 on stop layer 117. In some implementations, the oxidation operation may oxidate the surface of stop layer 117 exposed by openings 250. In some implementations, blocking structure 252 may be formed by silicon oxide.

As shown in FIG. 8, after forming blocking structure 252, each opening 250 is separated into the upper portion and the lower portion. Since blocking structure 252 is formed on the exposed surface of stop layer 117 along the x-direction and the y-direction and stop layer is formed at the edges of dielectric stack 103 in staircase structures 114, blocking structure 252 may define the position and length of a plurality of contact structure openings 119 above blocking structure 252 and a plurality of support structure openings 121 below blocking structure 252. Contact structure openings 119 and support structure openings 121 extend along the z-direction. In other words, contact structure openings 119 are formed in insulating structure 122, and support structure openings 121 are formed in dielectric stack 103.

As shown in FIG. 9 and operation 2014 in FIG. 20, contact structures 118 are formed in contact structure openings 119. In other words, contact structures 118 are formed in openings 250 above blocking structure 252, which is in insulating structure 122. Each contact structure 118 is in contact with blocking structure 252. In some implementations, contact structures 118 may be formed in contact structure openings 119 by using CVD, PVD, ALD, or other suitable processes. In some implementations, contact structure 118 may include conductive materials including, but not limited to, W, Co, Cu, Al, polysilicon, doped silicon, silicides, or any combination thereof.

Then, as shown in FIG. 10, peripheral device 112 is formed on dielectric stack 103 in electric contact with channel structures 108 and contact structures 118. As described above in FIG. 2, contact structures 118 may be arranged in multiple rows, and only a portion of the rows of contact structures 118 is in contact with peripheral device 112 through peripheral contacts 124.

After bonding peripheral device 112 with dielectric stack 103, the whole structure of 3D memory device 100 may be flipped over, and a subtract removal operation may be performed, as shown in FIG. 11. In some implementations, substrate 202 may be thinned and removed. In some implementations, a chemical-mechanical polishing (CMP) process may be performed to thin substrate 202, and a etch process may be then performed to remove substrate 202. In some implementations, substrate 202 may be removed by multiple removal operations, such as the wet etch, dry etching, or other suitable processes, until being stopped by dielectric layer 204. In some implementations, substrate 202 may be peeled off. After the removal of substrate 202, support structure openings 121 are exposed.

As shown in FIG. 12 and operation 2016 in FIG. 20, support structures 120 are formed in support structure openings 121. In other words, support structures 120 are formed in openings 250 below blocking structure 252, which is in dielectric stack 103. In some implementations, support structures 120 may be formed in support structure openings 121 by using CVD, PVD, ALD, or other suitable processes. In some implementations, support structures 120 may include dielectric materials. In some implementations, support structures 120 may include silicon oxide.

As shown in FIG. 13, the top portion of support structures 120 and dielectric layer 204 are then removed. In some implementations, the top portion of support structures 120 and dielectric layer 204 may be removed by CMP, dry etch, wet etch, or other suitable processes. After the removal operation, sacrificial structure 111 and semiconductive layer 206 are exposed.

As shown in FIG. 14, sacrificial structure 111 is removed to form a slit opening 113. In some implementations, sacrificial structure 111, semiconductive layer 206, and semiconductive layer 210 may be formed by the same material and may be removed together. In some implementations, sacrificial structure 111, semiconductive layer 206, and semiconductive layer 210 are formed by polysilicon and are removed together. In some implementations, sacrificial structure 111 may be removed by dry etch, wet etch, or other suitable processes. After removing semiconductive layer 206, the end portion of channel structures 108 is exposed.

As shown in FIG. 16 and operation 2018 in FIG. 20, dielectric layers 105 are replaced with conductive layers 104 (the word lines) through slit opening 113. In some implementations, dielectric layers 105 may be removed by dry etch, wet etch, or other suitable processes to form a plurality of cavities. The word lines may be formed in the cavities by sequentially deposing the gate dielectric layer made from high-k dielectric materials, the adhesion layer including titanium/titanium nitride (Ti/TiN) or tantalum/tantalum nitride (Ta/TaN), and the gate conductive made from tungsten. After the word line replacement operation, memory stack 102 is formed.

In the word line replacement operation, dielectric layers 105, blocking structure 252, and stop layer 117 are removed. In some implementations, dielectric layers 105, blocking structure 252, and stop layer 117 include the same material and can be removed together. In some implementations, dielectric layers 105, blocking structure 252, and stop layer 117 can be removed by multiple etch processes. After the word line replacement operation, staircase contact 116 may be formed on the landing area of the word lines. In some implementations, staircase contact 116 may include conductive materials including, but not limited to, W, Co, Cu, Al, polysilicon, doped silicon, silicides, or any combination thereof. In some implementations, the thickness of staircase contact 116 may be equal to or similar to the thickness of stop layer 117. In some implementations, the total thickness of staircase contact 116 and conductive layer 104 in the landing area may be greater than other areas, as shown in FIG. 15. After the word line replacement operation, contact structures 118 can be electrically coupled to the word lines (conductive layer 104) in the landing area through staircase contacts 116.

As shown in FIG. 16, slit structure 110 is formed in slit opening 113. Slit structure 110 may extend vertically along the z-direction through memory stack 102 and may also extend laterally along the x-direction to separate memory stack 102 into multiple fingers. In some implementations, slit structures 110 may be formed by using CVD, PVD, ALD, or other suitable processes. In some implementations, slit structures 110 may include a slit contact, formed by filling slit opening 113 with conductive materials including but not limited to, W, Co, Cu, Al, polysilicon, silicides, or any combination thereof. Slit structures 110 may further include a composite spacer disposed laterally between the slit contact and conductive layers 104 and dielectric layers 106 to electrically insulate the gate line slit structure from surrounding conductive layers 104 (the gate conductive layers in memory stacks). In some implementations, slit structures 110 may include dielectric materials when the slit contact is not required in 3D memory device 100. When forming slit structure 110, a first semiconductive layer 220 may also be formed covering memory stack 102.

As shown in FIG. 17, first semiconductive layer 220 covering channel structures 108 (the core area) is removed to expose the end of channel structures 108. Then, an implantation operation may be performed on the end of channel structures 108. As shown in FIG. 18, a second semiconductive layer 222 is formed covering the core area and first semiconductive layer 220. In some implementations, second semiconductive layer 222 may be polysilicon. In some implementations, second semiconductive layer 222 may be doped polysilicon. In some implementations, second semiconductive layer 222 may be n-type doped polysilicon. In some implementations, an anneal operation may be further performed on second semiconductive layer 222.

By forming support structures 120 vertically aligning contact structures 118 and forming contact structures 118 and support structures 120 through opposite sides of 3D memory device 100, the supporting strength during the manufacturing processes can be improved. In addition, the space window for the contact landing design can be increased. Hence, the number of 3D memory layers and the size of 3D memory device 100 can be taken into consideration together without conflict.

Figure 21:
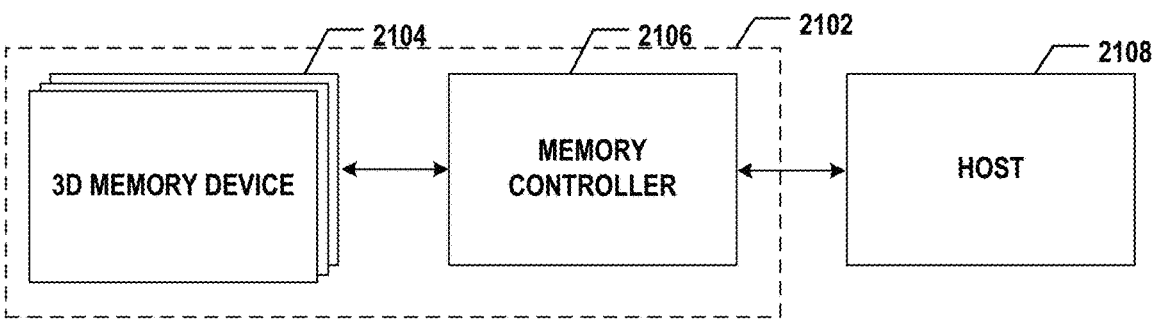
FIG. 21 illustrates a block diagram of an exemplary system having a memory device, according to some aspects of the present disclosure.

FIG. 21 illustrates a block diagram of an exemplary system 2100 having a memory device, according to some aspects of the present disclosure. System 2100 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 21, system 2100 can include a host 2108 and a memory system 2102 having one or more memory devices 2104 and a memory controller 2106. Host 2108 can be a processor of an electronic device, such as a central processing unit (CPU), or a system-on-chip (SoC), such as an application processor (AP). Host 2108 can be configured to send or receive data to or from memory devices 2104.

Memory device 2104 can be any memory device disclosed in the present disclosure. As disclosed above in detail, memory device 2104, such as a NAND Flash memory device, may have a controlled and predefined discharge current in the discharge operation of discharging the bit lines. Memory controller 2106 is coupled to memory device 2104 and host 2108 and is configured to control memory device 2104, according to some implementations. Memory controller 2106 can manage the data stored in memory device 2104 and communicate with host 2108. For example, memory controller 2106 may be coupled to memory device 2104, such as 3D memory device 100 described above, and memory controller 2106 may be configured to control the operations of channel structure 108 through peripheral device 112. By forming support structures 120 vertically aligning contact structures 118 and forming contact structures 118 and support structures 120 through opposite sides of 3D memory device 100, the supporting strength during the manufacturing processes can be improved. In addition, the space window for the contact landing design can be increased. Hence, the number of 3D memory layers and the size of 3D memory device 100 can be taken into consideration together without conflict.

In some implementations, memory controller 2106 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 2106 is designed for operating in a high duty-cycle environment SSDs or embedded multi-media-cards (eMMCs) used as data storage for mobile devices, such as smartphones, tablets, laptop computers, etc., and enterprise storage arrays. Memory controller 2106 can be configured to control operations of memory device 2104, such as read, erase, and program operations. Memory controller 2106 can also be configured to manage various functions with respect to the data stored or to be stored in memory device 2104 including, but not limited to bad-block management, garbage collection, logical-to-physical address conversion, wear leveling, etc. In some implementations, memory controller 2106 is further configured to process error correction codes (ECCs) with respect to the data read from or written to memory device 2104. Any other suitable functions may be performed by memory controller 2106 as well, for example, formatting memory device 2104. Memory controller 2106 can communicate with an external device (e.g., host 2108) according to a particular communication protocol. For example, memory controller 2106 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figure 22A:
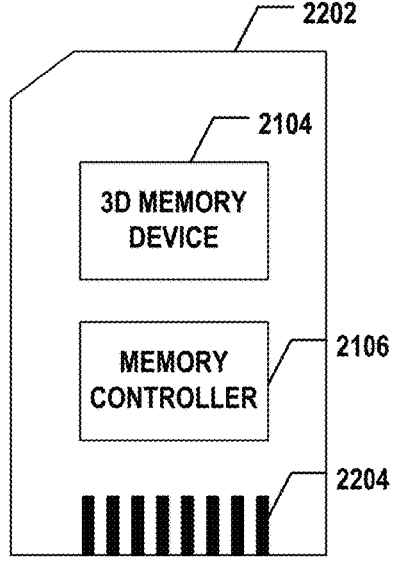
FIG. 22A illustrates a diagram of an exemplary memory card having a memory device, according to some aspects of the present disclosure.
Figure 22B:
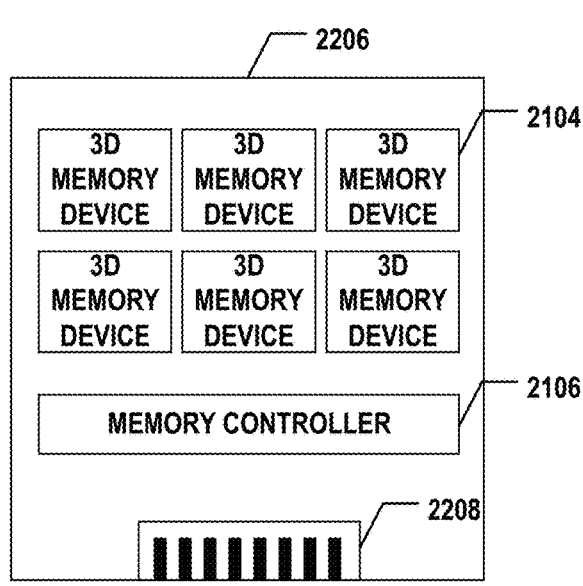
FIG. 22B illustrates a diagram of an exemplary solid-state drive (SSD) having a memory device, according to some aspects of the present disclosure.

Memory controller 2106 and one or more memory devices 2104 can be integrated into various types of storage devices, for example, be included in the same package, such as a universal Flash storage (UFS) package or an eMMC package. That is, memory system 2102 can be implemented and packaged into different types of end electronic products. In one example as shown in FIG. 22A, memory controller 2106 and a single memory device 2104 may be integrated into a memory card 2202. Memory card 2202 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 2202 can further include a memory card connector 2204 coupling memory card 2202 with a host (e.g., host 2108 in FIG. 21). In another example as shown in FIG. 22B, memory controller 2106 and multiple memory devices 2104 may be integrated into an SSD 2206. SSD 2206 can further include an SSD connector 2208 coupling SSD 2206 with a host (e.g., host 2108 in FIG. 21). In some implementations, the storage capacity and/or the operation speed of SSD 2206 is greater than those of memory card 2202.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A three-dimensional (3D) memory device, comprising:
a stack comprising a plurality of conductive layers and a plurality of dielectric layers stacked alternatingly, wherein the stack comprises a staircase structure;
an insulating structure over the stack and the staircase structure;
a plurality of contact structures each extending through the insulating structure and in contact with a respective conductive layer of the plurality of conductive layers in the staircase structure;
a plurality of support structures extending through the stack in the staircase structure;
a first semiconductor layer under the stack;
a second semiconductor layer under the first semiconductor layer; and
a channel structure extending through the stack and in contact with the second semiconductor layer,
wherein the plurality of contact structures are arranged in a first row and a second row along a first direction, the first row is adjacent and parallel to the second row, the first row of the plurality of contact structures is in electrical contact with a peripheral device, and the second row of the plurality of contact structures is in electrical insulation with the peripheral device;
wherein one or more than one adjacent level of the staircase structure is vertically offset by a nominally same distance in the first direction;
wherein the plurality of support structures extend through the first semiconductor layer and extend into the second semiconductor layer; and
wherein the first semiconductor layer and the channel structure are separated by the second semiconductor layer.

2. The 3D memory device of claim 1, wherein each of the plurality of contact structures further comprises a staircase contact in contact with the respective conductive layer of the plurality of conductive layers.

3. The 3D memory device of claim 2, wherein the staircase contact is disposed between the plurality of contact structures and the plurality of support structures.

4. The 3D memory device of claim 3, wherein the plurality of contact structures and the plurality of support structures overlap in a plan view of the 3D memory device.

5. The 3D memory device of claim 4, wherein each of the plurality of support structures aligns one of the plurality of contact structures.

6. The 3D memory device of claim 1, wherein the plurality of contact structures and the plurality of support structures comprise different materials.

7. The 3D memory device of claim 6, wherein the plurality of support structures comprise a dielectric material.

8. The 3D memory device of claim 7, wherein the plurality of contact structures comprise a conductive material.

9. The 3D memory device of claim 1, wherein the first semiconductor layer and the plurality of contact structures are separated by at least one of the plurality of conductive layers.

10. The 3D memory device of claim 3, wherein each of the plurality of contact structures comprises a first end away from the staircase contact and a second end near the staircase contact, and a width of the first end is greater than a width of the second end.

11. The 3D memory device of claim 10, wherein each of the plurality of support structures comprises a third end near the staircase contact and a fourth end away from the staircase contact, and a width of the third end is greater than a width of the fourth end.

12. The 3D memory device of claim 11, wherein the width of the first end is greater than the width of the third end.

13. A system, comprising:
a three-dimensional (3D) memory device configured to store data, the 3D memory device comprising:
a stack in an insulating structure comprising a plurality of conductive layers and a plurality of dielectric layers stacked alternatingly, wherein the stack comprises a staircase structure;
a plurality of contact structures each extending through the insulating structure and in contact with a respective conductive layer of the plurality of conductive layers in the staircase structure;
a plurality of support structures extending through the stack in the staircase structure;
a first semiconductor layer under the stack;
a second semiconductor layer under the first semiconductor layer; and
a channel structure extending through the stack and in contact with the second semiconductor layer; and
a memory controller coupled to the 3D memory device and configured to control operations of the 3D memory device,
wherein the plurality of contact structures are arranged in a first row and a second row along a first direction, the first row is adjacent and parallel to the second row, the first row of the plurality of contact structures is in electrical contact with a peripheral device, and the second row of the plurality of contact structures is in electrical insulation with the peripheral device;
wherein one or more than one adjacent level of the staircase structure is vertically offset by a nominally same distance in the first direction;
wherein the plurality of support structures extend through the first semiconductor layer and extend into the second semiconductor layer; and
wherein the first semiconductor layer and the channel structure are separated by the second semiconductor layer.

14. The 3D memory device of claim 1, wherein the first row and the second row extend along a same direction with a height decreasing direction of the staircase structure.

15. The system of claim 13, wherein the first row and the second row extend along a same direction with a height decreasing direction of the staircase structure.

16. The system of claim 13, wherein each of the plurality of contact structures further comprises a staircase contact in contact with the respective conductive layer of the plurality of conductive layers.

17. The system of claim 16, wherein the staircase contact is disposed between the plurality of contact structures and the plurality of support structures.

18. The system of claim 17, wherein the plurality of contact structures and the plurality of support structures overlap in a plan view of the 3D memory device.

19. The system of claim 18, wherein each of the plurality of support structures aligns one of the plurality of contact structures.

* * * * *